United States Patent [19]

Turi et al.

[11] Patent Number: 4,516,313

[45] Date of Patent: May 14, 1985

[54] UNIFIED CMOS/SNOS SEMICONDUCTOR FABRICATION PROCESS

[75] Inventors: Raymond A. Turi, Miamisburg; Robert F. Pfeifer, Centerville, both of Ohio

[73] Assignee: NCR Corporation, Dayton, Ohio

[21] Appl. No.: 499,044

[22] Filed: May 27, 1983

[51] Int. Cl.[3] ...................... H01L 21/76; H01L 21/90
[52] U.S. Cl. .................................. 29/571; 29/577 C; 357/42
[58] Field of Search .................. 148/1.5, 187; 29/571, 29/577 C, 591; 357/23 VT, 41, 42

[56] References Cited

U.S. PATENT DOCUMENTS

| | | | |
|---|---|---|---|
| 4,345,366 | 8/1982 | Brower | 29/577 C X |
| 4,373,253 | 2/1983 | Khadder et al. | 29/576 B |
| 4,380,804 | 4/1983 | Lockwood et al. | 357/23 VT X |
| 4,422,885 | 12/1983 | Brower et al. | 29/578 X |
| 4,454,648 | 6/1984 | Hsia | 29/571 X |

FOREIGN PATENT DOCUMENTS 2080024 1/1982 United Kingdom .
2103880 2/1983 United Kingdom .

OTHER PUBLICATIONS

S. Fukanaga et al., "FA-CMOS Process for Low Power PROM with Low Avalanche Injection Voltage", IEDM Technical Digest 1977, International Electron Devices Meeting, 5, 6, 7, Dec. 1977, Washington, D.C., 1977 (NY, US) No. 14.5 pp. 291–293.

DeWitt Ong, "An All-Implanted CCD/CMOS Process", IEEE Transactions on Electron Devices, vol. ED-28, No. 1, Jan. 1981 (NY, US) pp. 6–12.

Anantha, N. G. "Simultaneously Forming Memory and Support Circuits Using FETS", in *I.B.M.-T.D.B.* vol. 16, No. 4, 9-1973, pp. 1037–1038.

Chen, P. C. Y. "Threshold-Alterable Si-Gate MOS Devices" *IEEE Trans. on Electron Devices*, vol. ED-24, No. 5, May 1977, pp. 584–586.

*Primary Examiner*—Brian E. Hearn
*Assistant Examiner*—Alan E. Schiavelli
*Attorney, Agent, or Firm*—J. T. Cavender; Casimer K. Salys

[57] ABSTRACT

A unified process for fabricating CMOS and SNOS devices on a common wafer. The process provides for the formation of poly resistors and interconnects at multiple levels while eliminating residual silicon nitride from active devices excepting the nonvolatile SNOS type memory cells. Foremost, the process significantly reduces the number of masking operations while limiting the fabrication temperatures at stages after the formation of the memory device dielectric. In the preferred arrangement, the process prescribes the formation of p and n-wells, gate oxides over the wells, and a patterned conductive poly layer thereupon. By alternate photoresist masking, the source/drain regions in the respective wells are then doped to coincide with the corresponding poly layer patterns. Thereafter, the SNOS device operational characteristics are refined, a first isolation layer of silicon dioxide is grown, and the memory dielectric is sequentially formed. Following the deposition of another conductive poly layer, this layer and the underlying silicon nitride from the memory dielectric are together selectively etched to retain the second layer of poly only at interconnect locations, resistors and the SNOS devices. Fabrication is concluded with the formation of a second isolation oxide and a patterned layer of interconnect metal.

14 Claims, 38 Drawing Figures

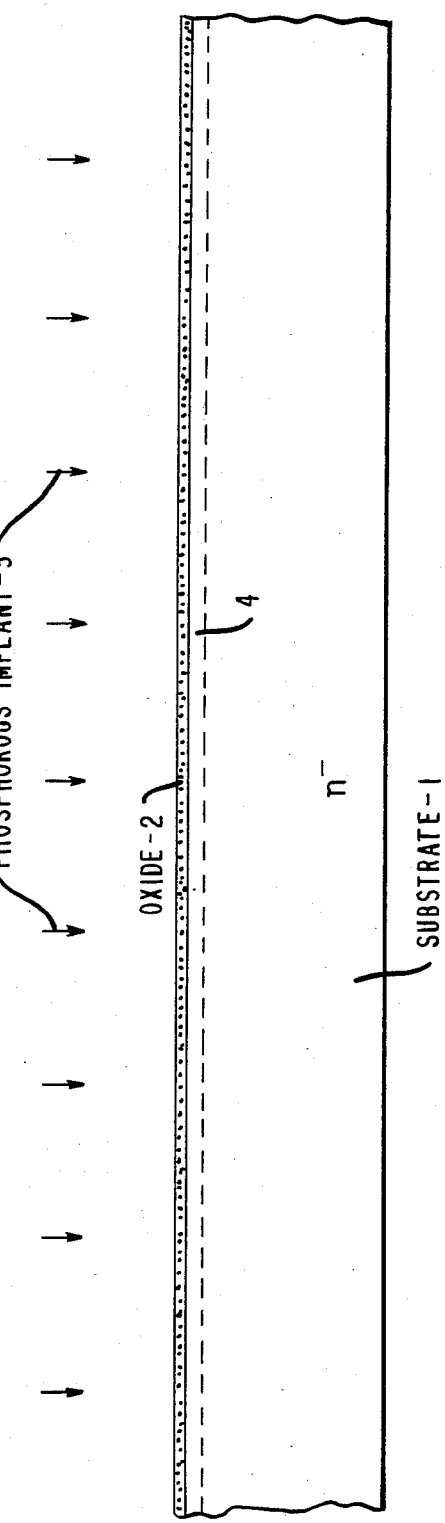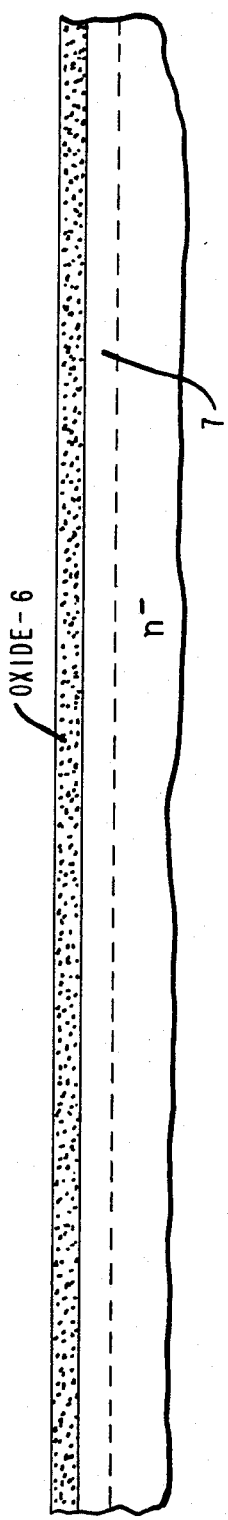

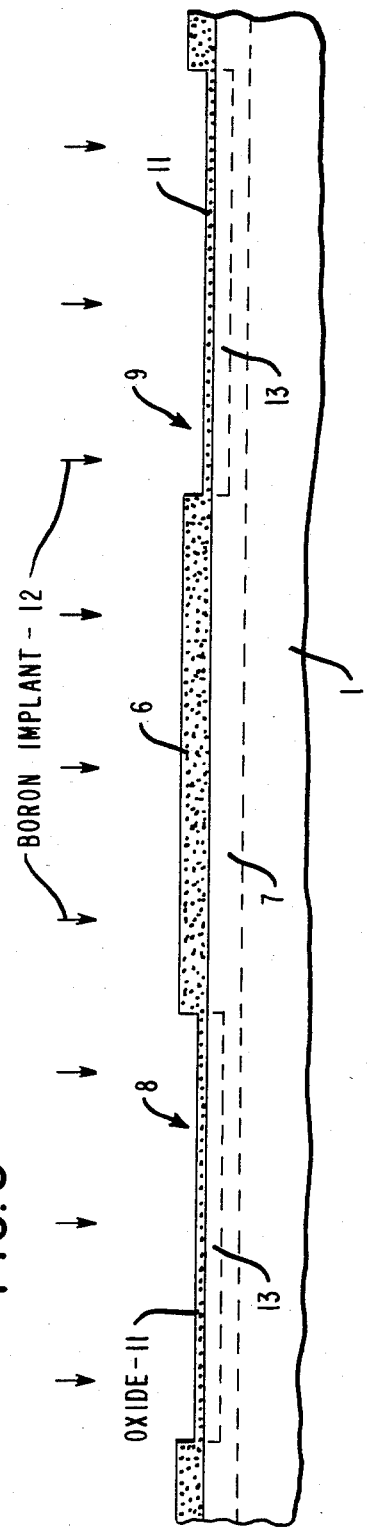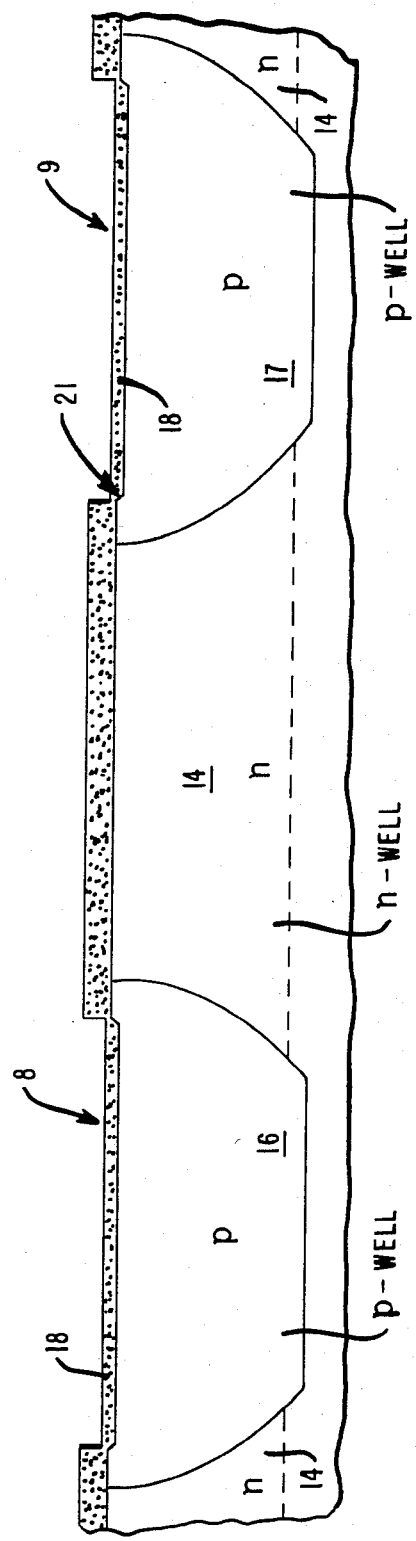

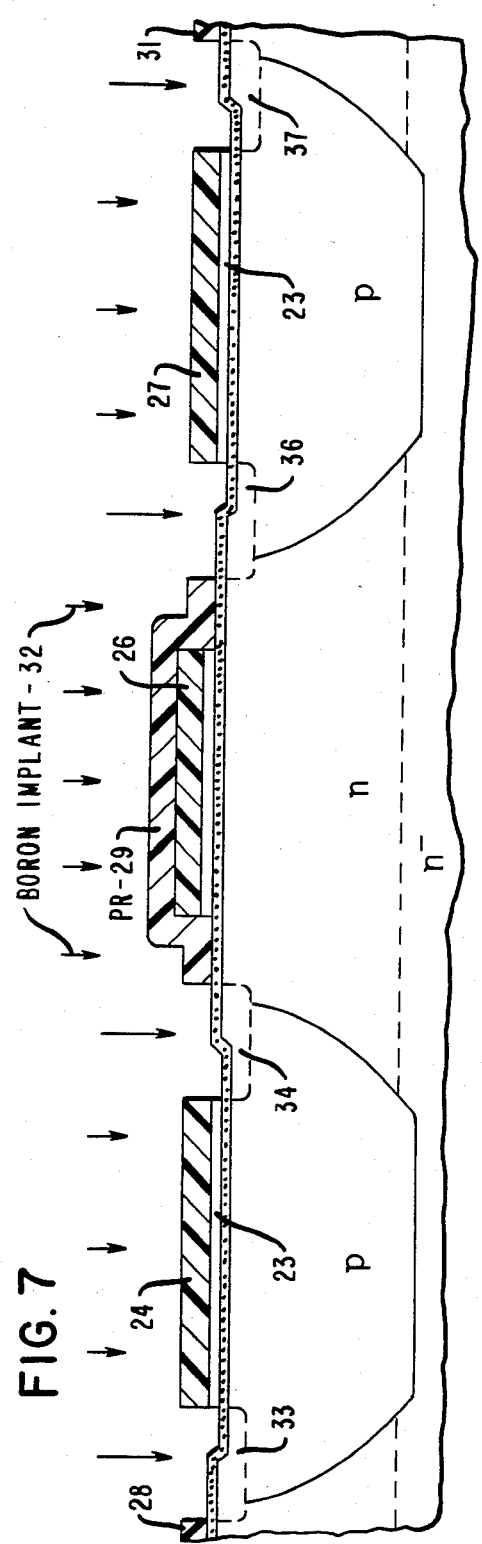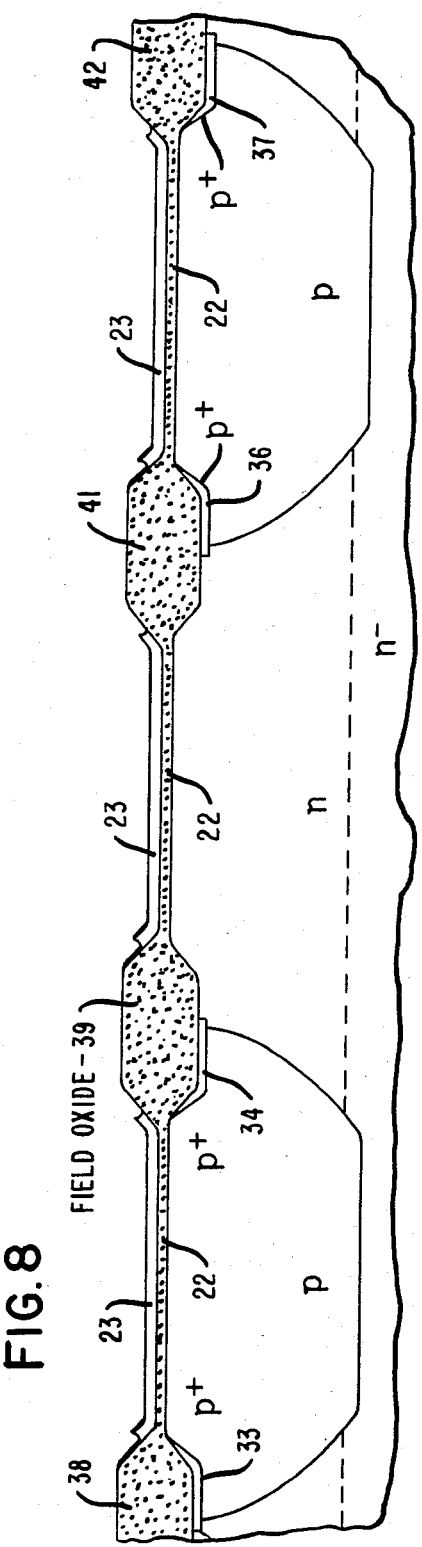

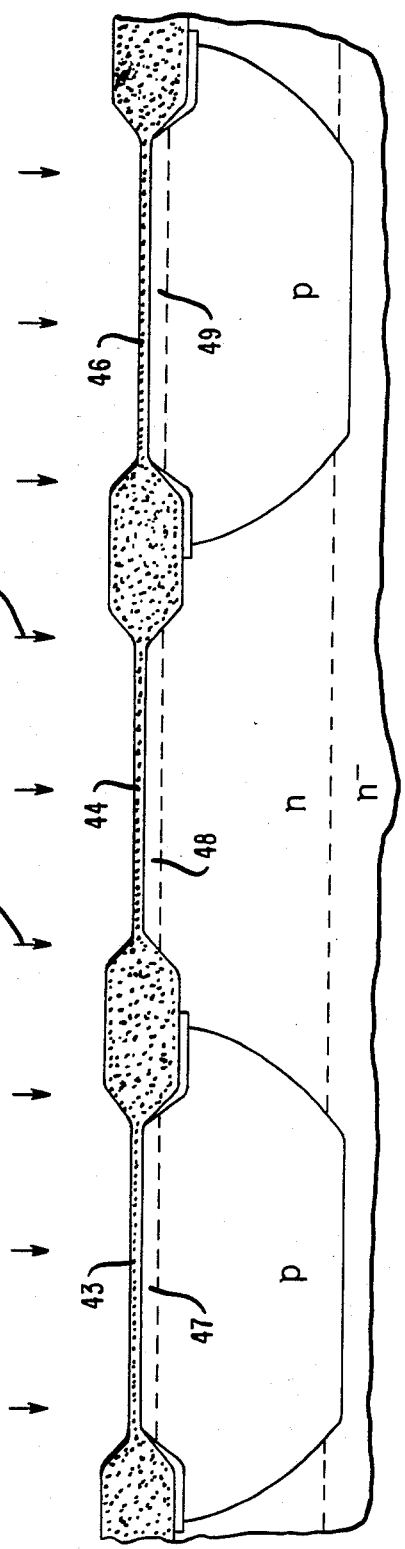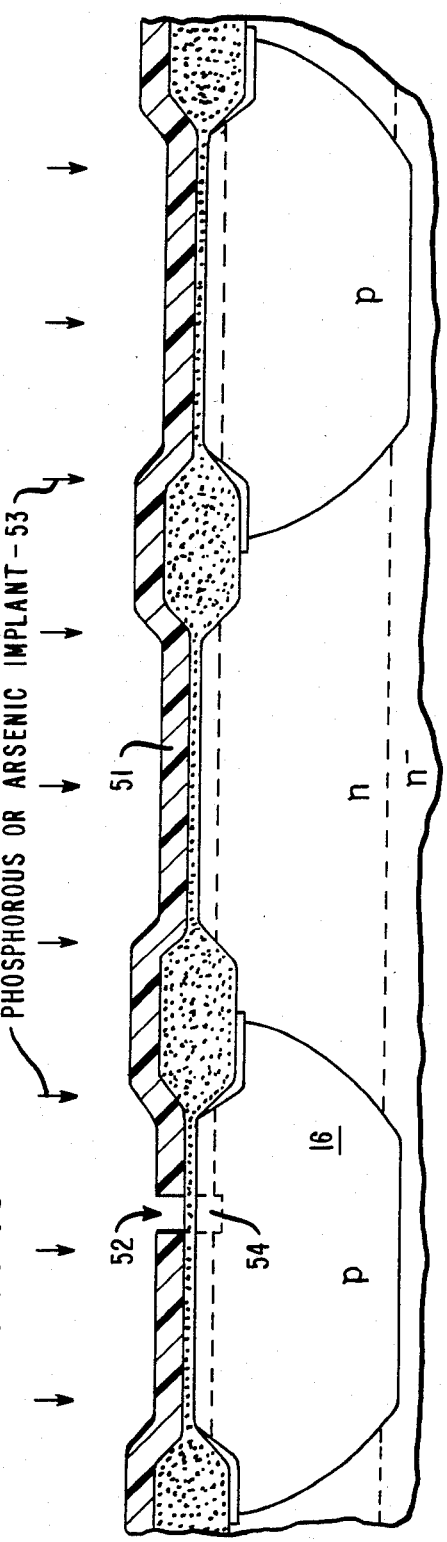

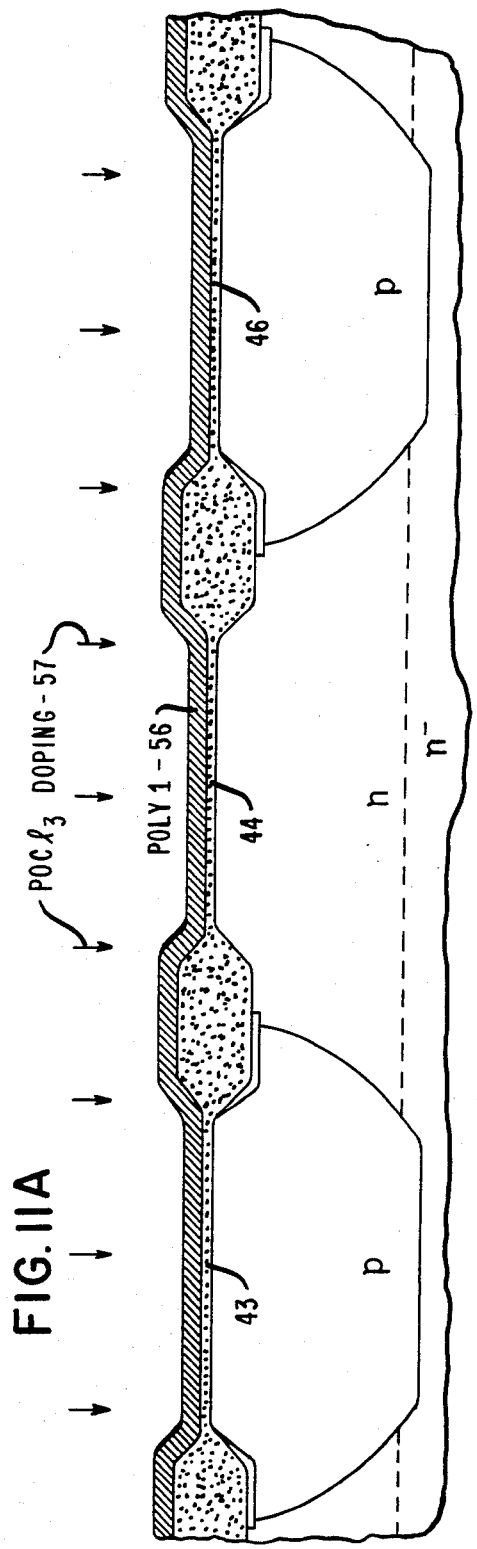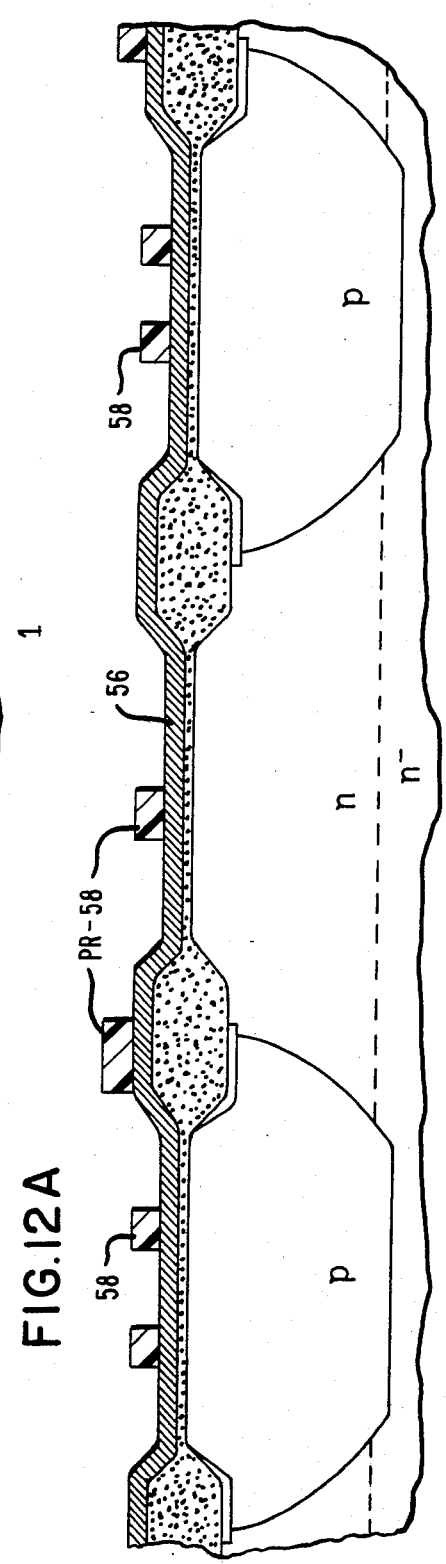

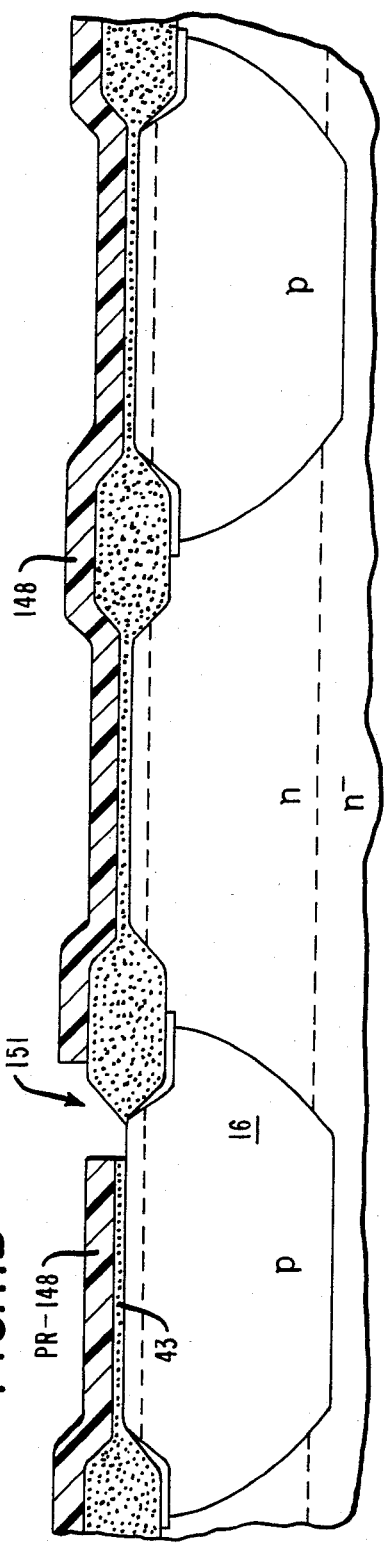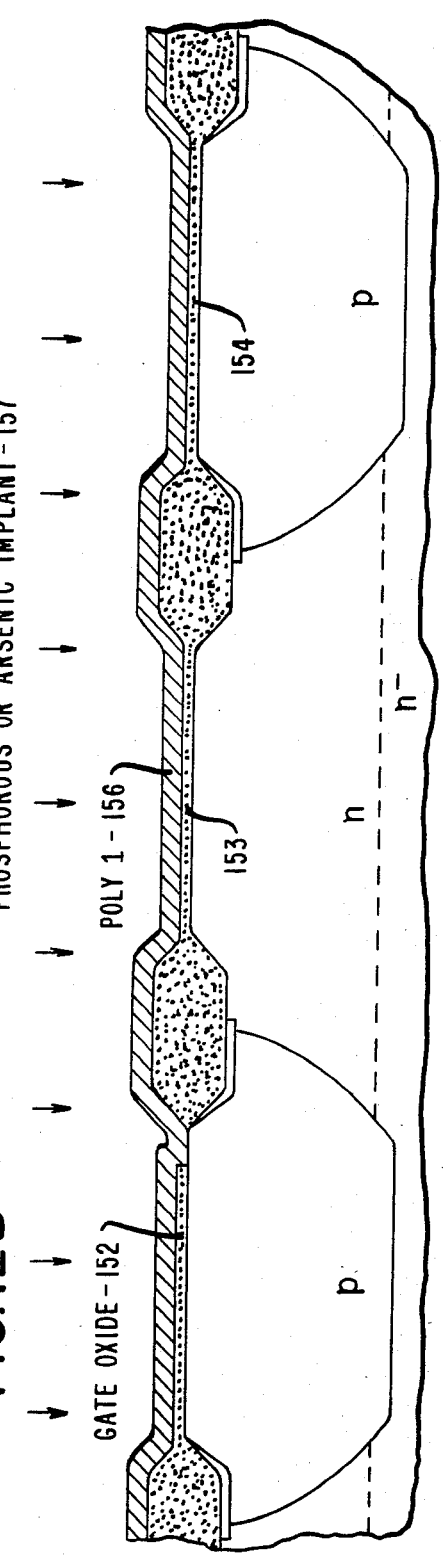

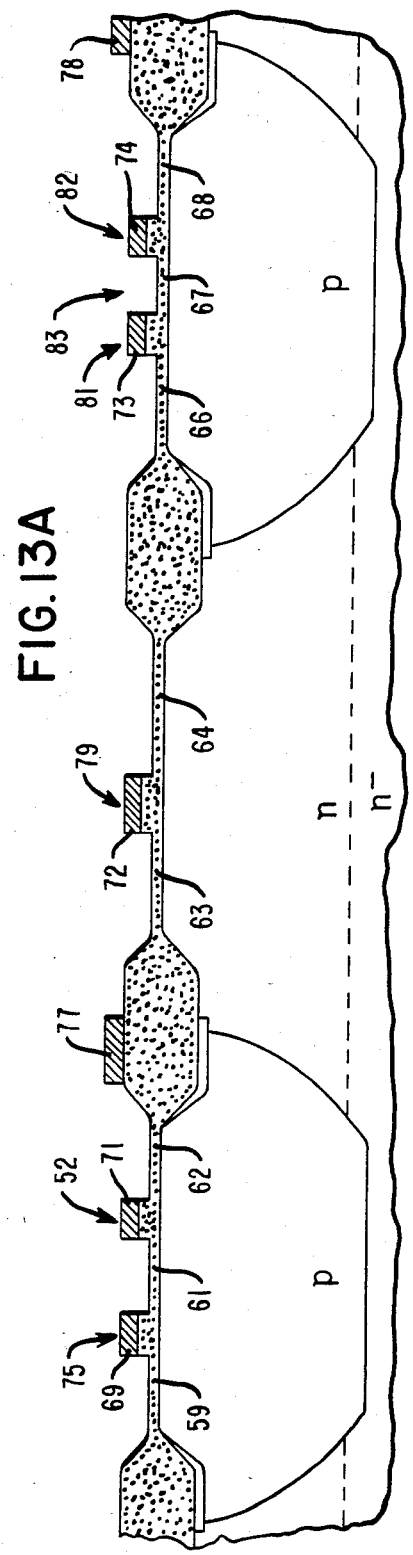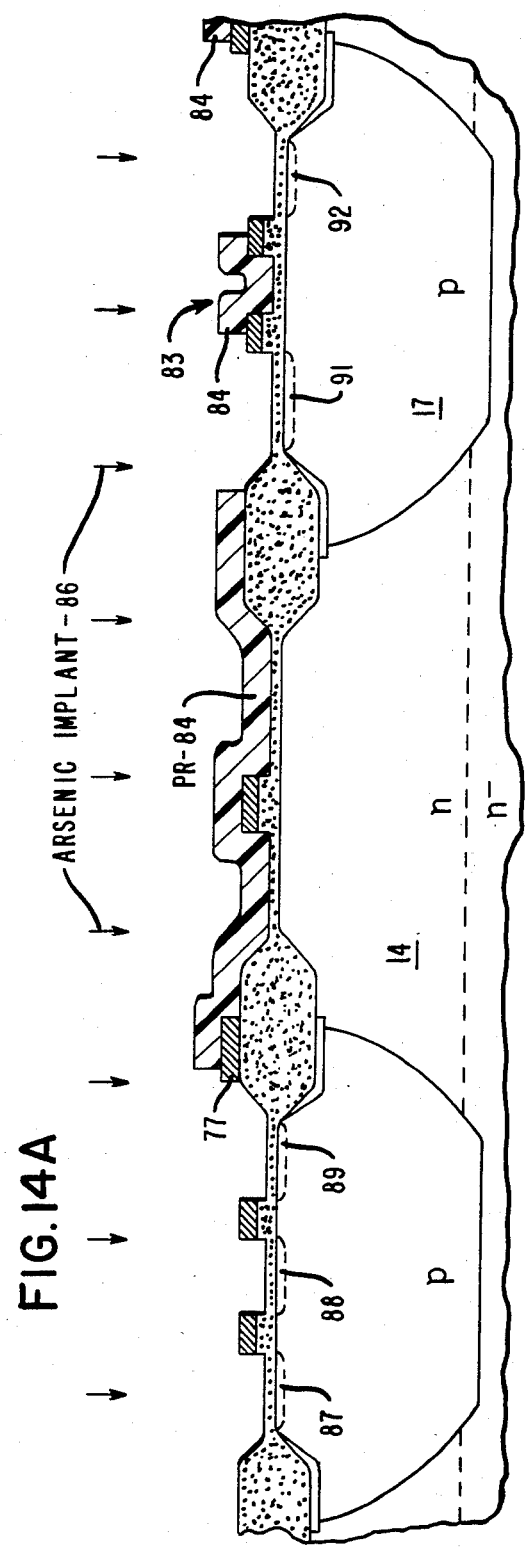

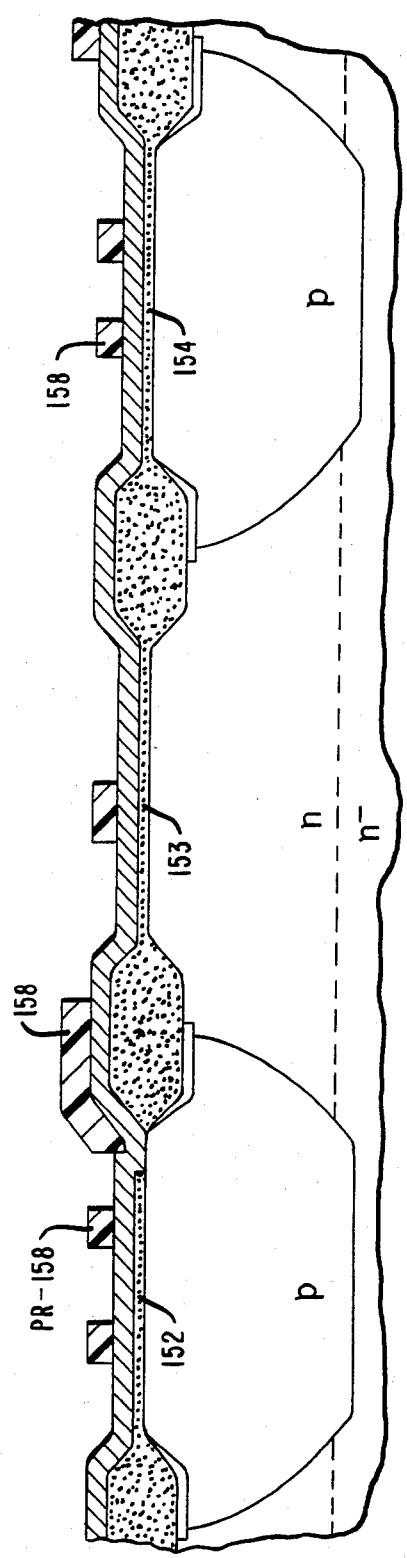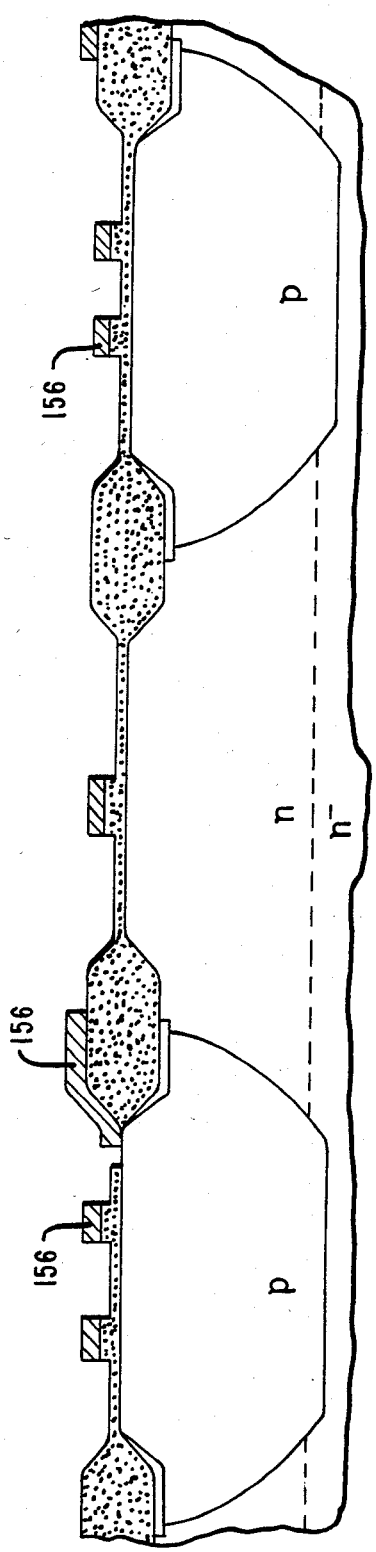

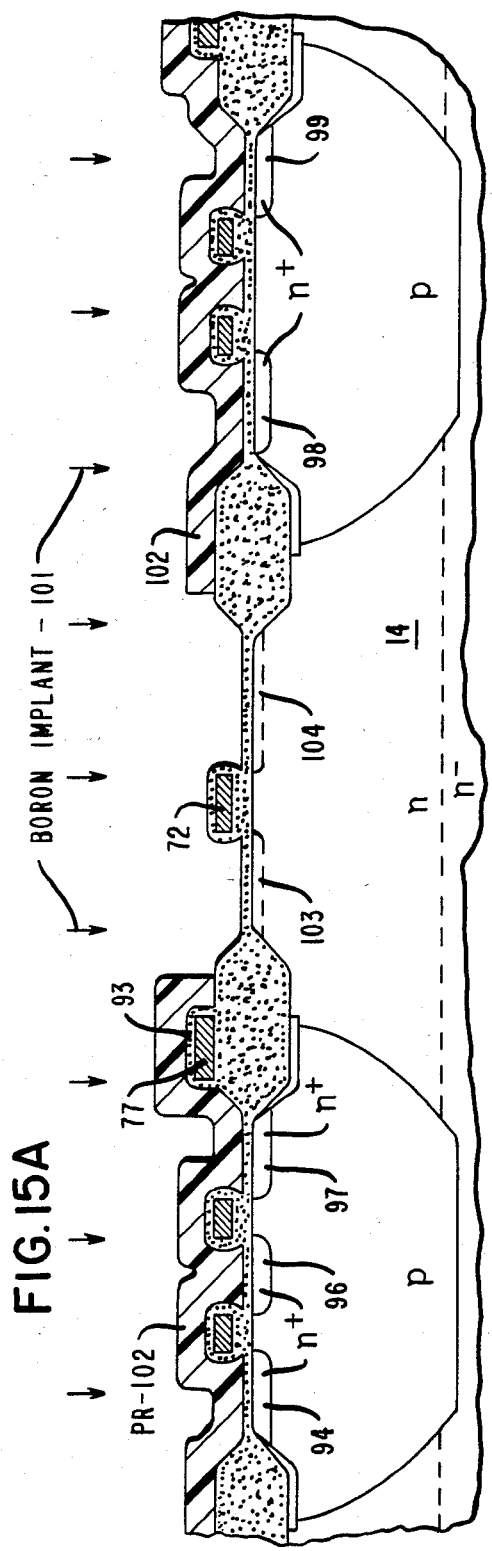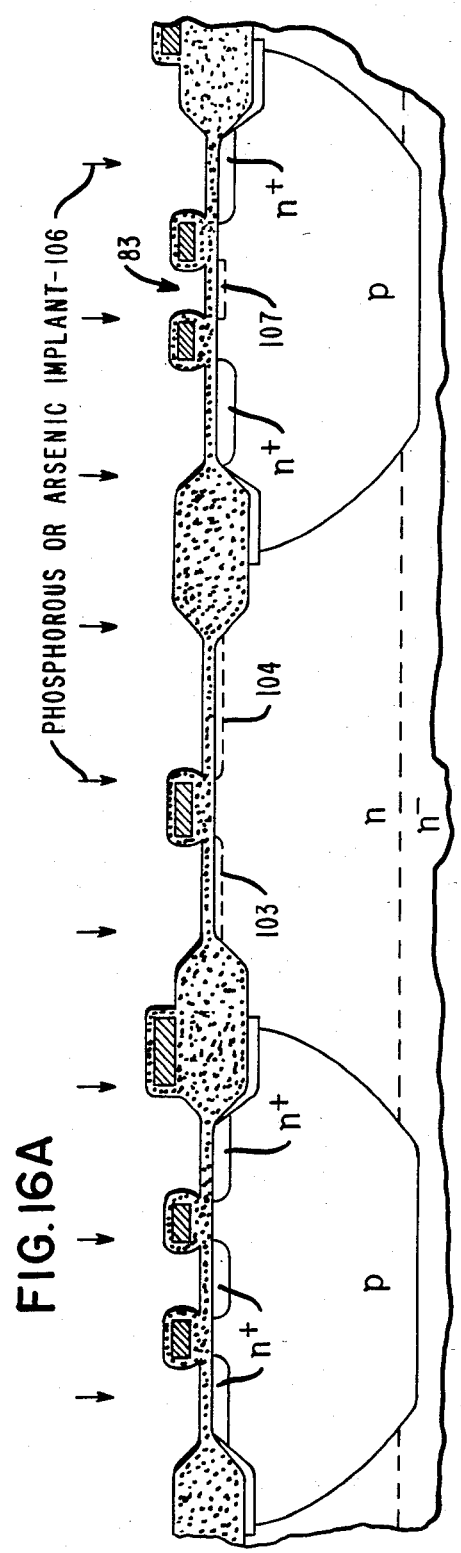

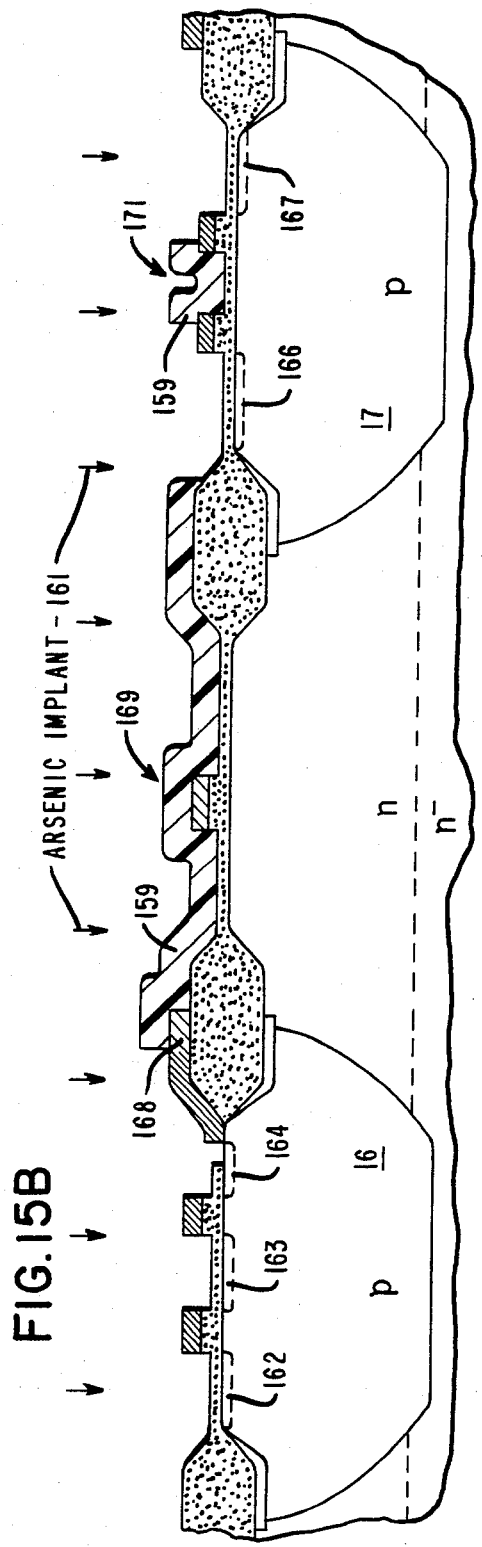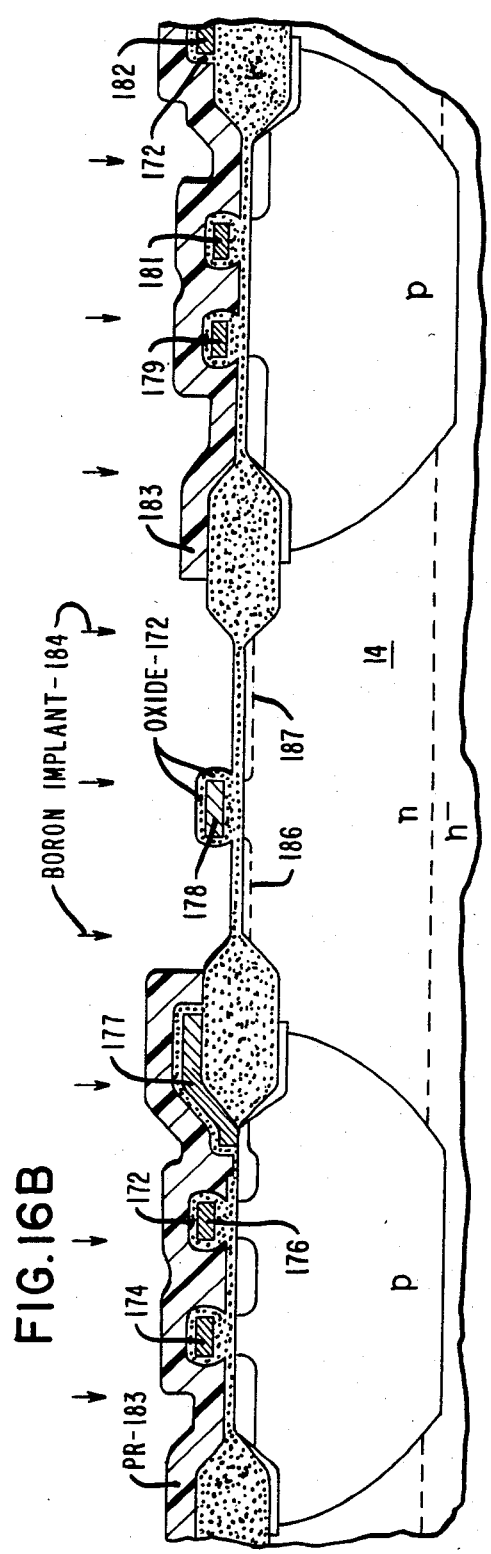

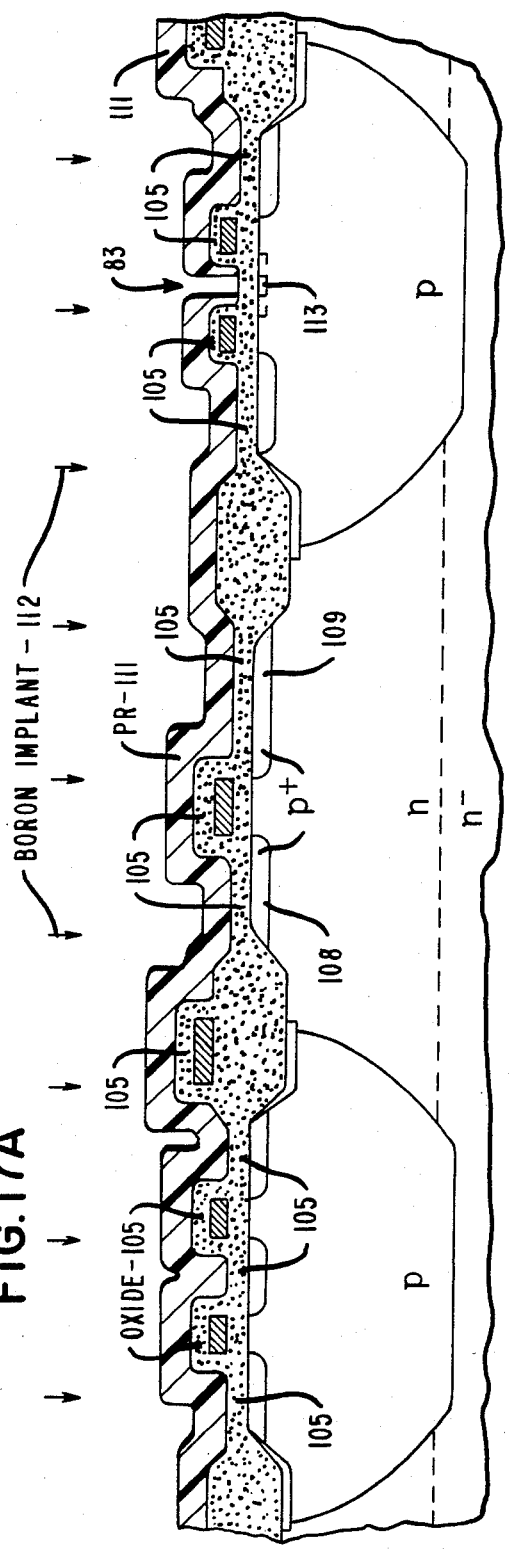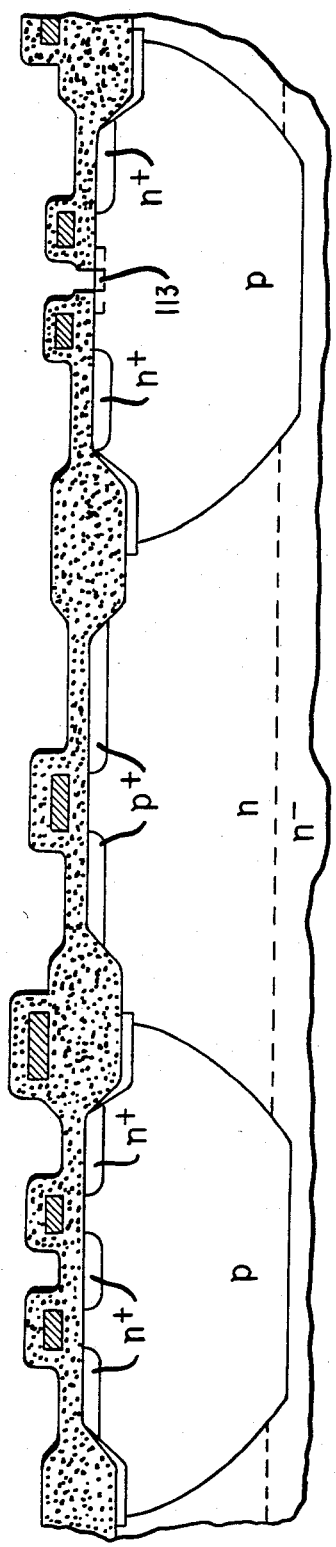
FIG.17A
FIG.18A

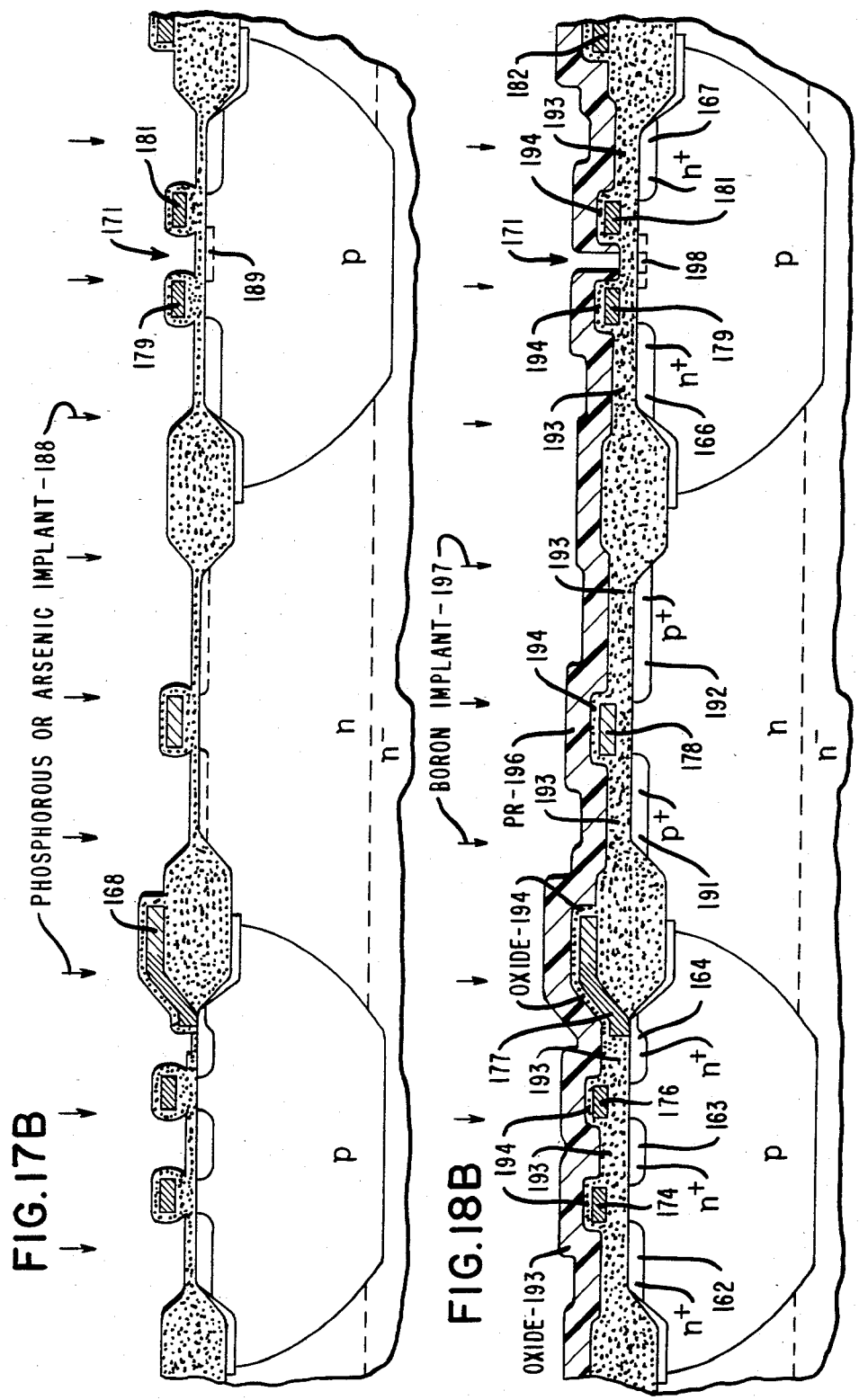

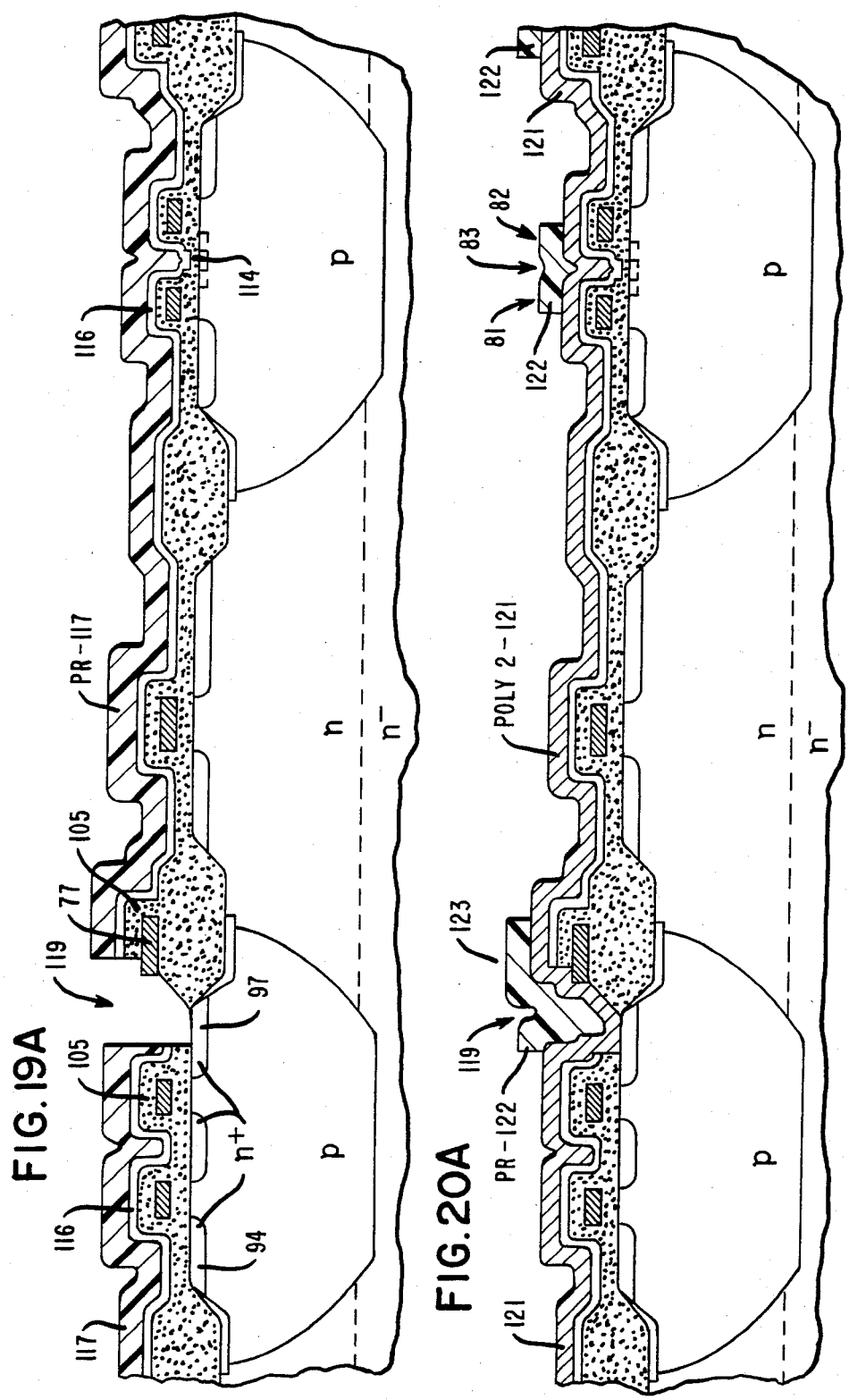

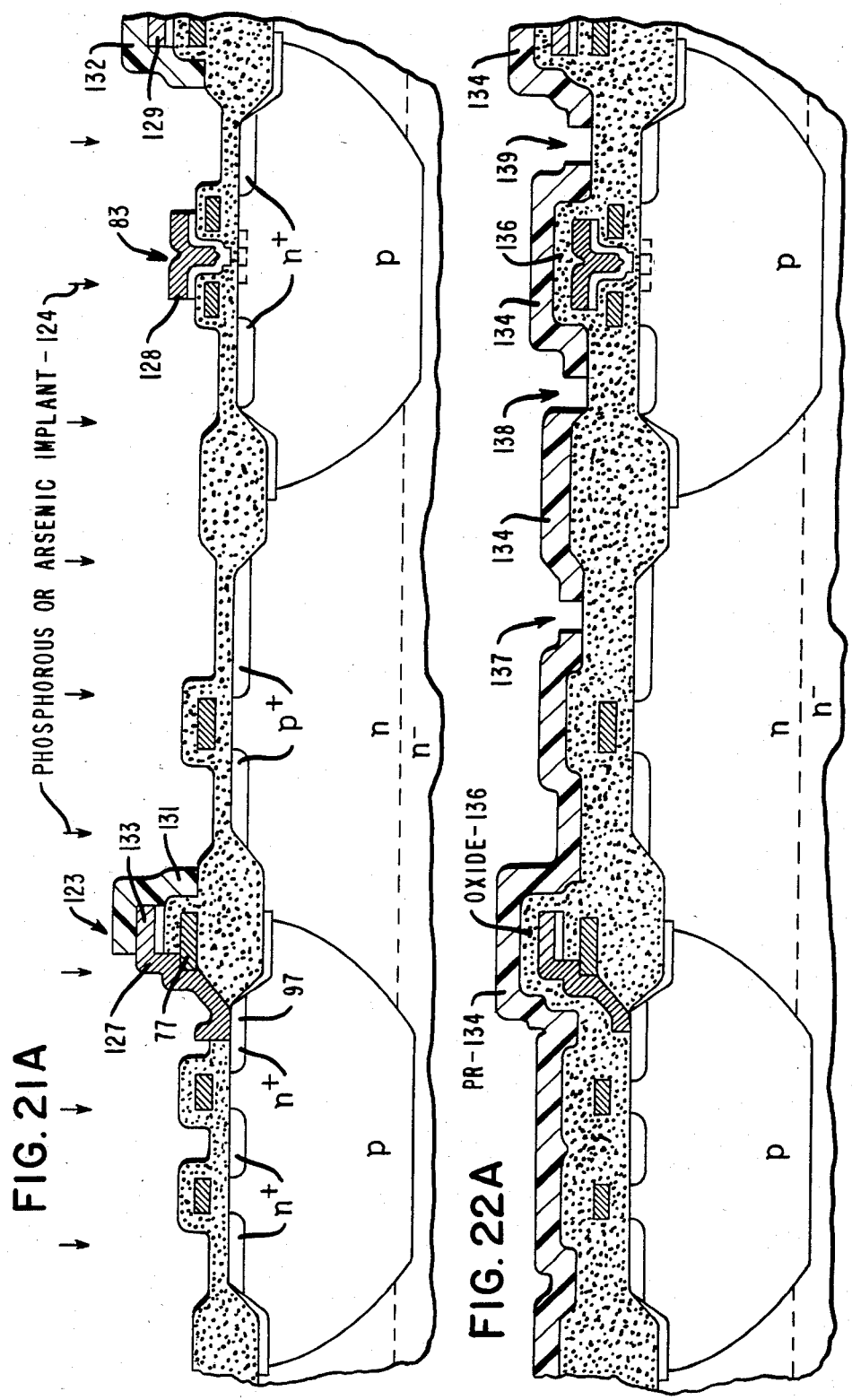

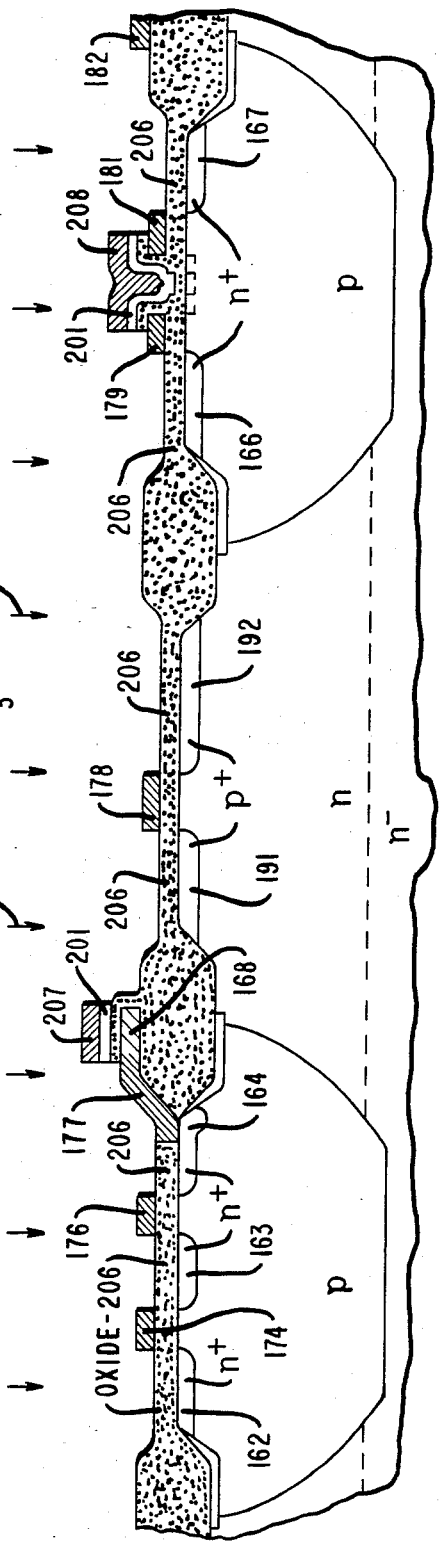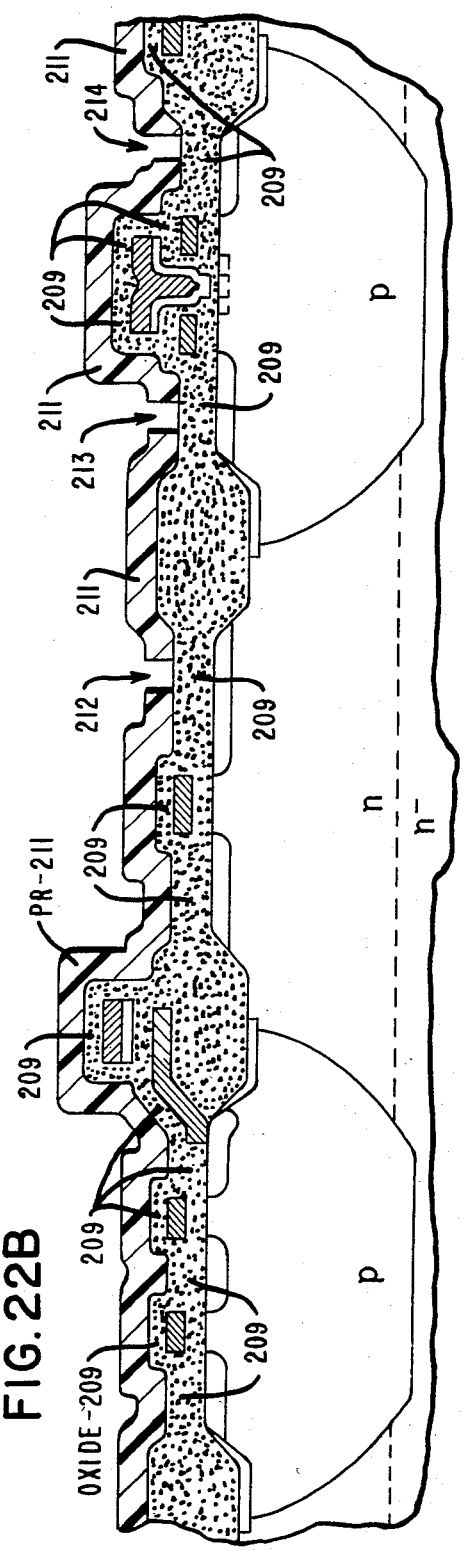

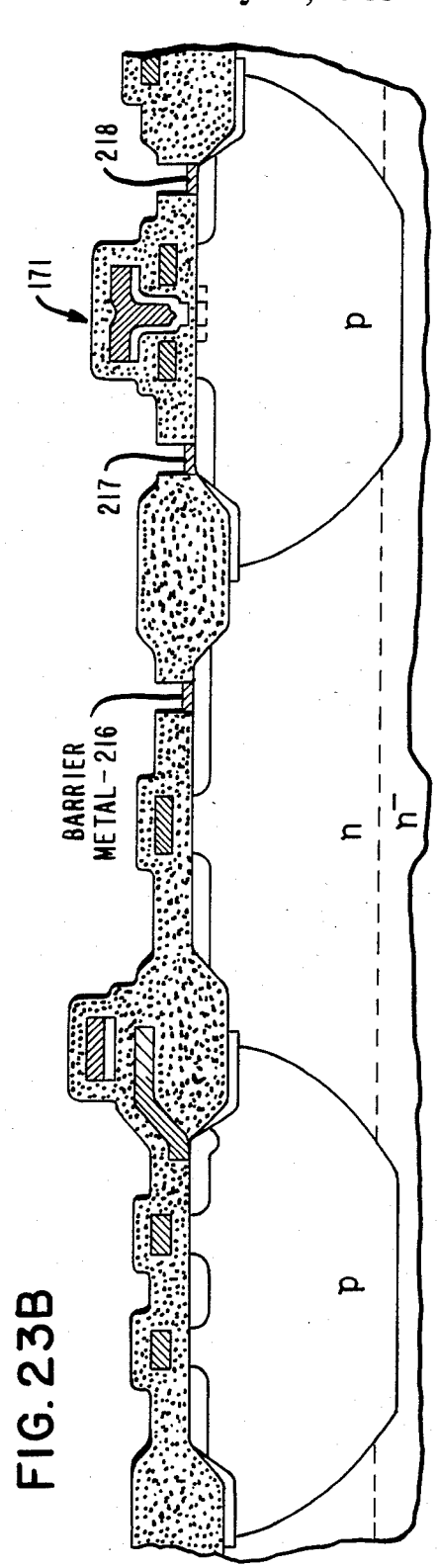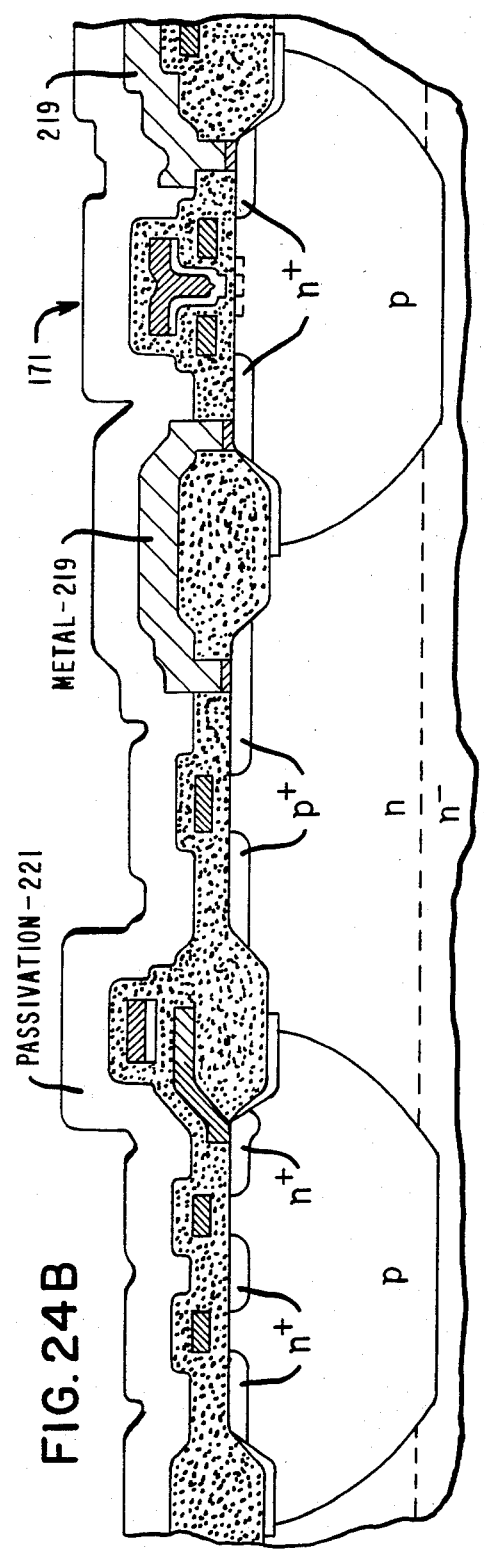
FIG. 23B
FIG. 24B

UNIFIED CMOS/SNOS SEMICONDUCTOR FABRICATION PROCESS

BACKGROUND OF THE INVENTION

The present invention relates to a unified process for the fabrication of complementary metal oxide semiconductor (CMOS) and silicon nitride oxide semiconductor (SNOS) devices on a common wafer, with provisions for polycrystalline silicon (poly) resistors, and poly and diffused interconnects. In particular, the present process features the fabrication of SNOS type electrically erasable programmable read only memories (EEPROMs) and nonvolatile random access memories (NVRAMs) formed in electrically isolated wells to provide means for erasing and writing of data at the bit level.

Processes which are suitable to fabricate CMOS devices or nonvolatile SNOS type memory cells have been the subject of extensive individual development and refinement in recent years. As an example, consider the subject matter in U.S. Pat. No. 4,380,804 by inventors Lockwood et al., and in the U.S. patent applications having Ser. Nos. 352,734 and 332,037, now U.S. Pat. No. 4,422,885, by inventors Dham et al. and Brower et al., respectively, all commonly assigned to the assignee of the present application. From the teachings in the latter two, one is apprised of the fundamentals in the fabrication of CMOS devices by the formation of wells, and the formation of conventional field effect transistors (FETs) in combination SNOS type memory cells on a common chip but with the selectively retained regions of silicon nitride (nitride) layer. Heretofore, a unified process has generally been considered too complex, in view of the anticipated count of the masking operations and the complexity of the overall process mix. The dissuading effects become particularly pronounced when one recognizes that the memory dielectric in the SNOS type memory device is degraded as to its fundamental data retention characteristic if the wafer is subjected to any high temperature fabrication environments after the formation of the memory dielectric.

BRIEF SUMMARY

The present invention features a unified process of uniquely interleaved steps which produce electrically isolated SNOS type memory devices and CMOS devices on a common substrate or wafer while ensuring that the latter stages of the fabrication process do not impose temperatures which may degrade the data retention characteristics of the nonvolatile SNOS memory cells. In particular, the process provides for the fabrication of FET devices with self-aligned n-type poly gates; p and n-well isolation through the selective oxidation of the substrate silicon; poly 1 or poly 2 level resistors and interconnects; electrically isolated p-channel FETs, n-channel FETs and nonvolatile SNOS type memory cells on a common chip; the absence of charge trapping silicon nitride residuals; the discretionary tailoring of FET characteristics for enhancement or depletion mode operation; and significant reductions in the number of fabrication masks employed. Foremost, however, these commonly sought features are attained in a process sequence which eliminates or substantially minimizes exposure of the memory dielectric to high temperature environments.

According to one embodiment of the invention, n-channel FETs and SNOS type memory cells are established in p-wells which are themselves formed within an n-well diffusion of the n$^-$ type substrate. At the substrate surface the wells are separated by selectively grown fields of silicon dioxide (oxide). Following the formation of an oxide gate dielectric over the active regions between the field oxides, a poly 1 gate electrode and interconnect layer is deposited, conductively doped and patterned. The source/drain (S/D) regions of the n-channel devices are then subjected to an implant doping operation, while masking is provided over the p-channel devices and SNOS type memory devices with patterned photoresist (PR). Thereafter, the p-channel S/D regions are similarly implanted while the n-channel and SNOS type memory devices regions are masked with PR. A blanket depletion implant for the poly 2 layer active devices, and an isolation oxide growth from all exposed silicon, follow. Next, a new PR layer is deposited and patterned to expose the memory device for a distinct memory implant and immediately succeeding etch of the underlying oxide. The silicon substrate exposed by the oxide etch is subjected to a sequence of memory dielectric fabrication, beginning with the growth of the thin memory oxide and concluding with the formation of a nitride-based memory dielectric.

Continuing with the first embodiment, contact openings for the poly 2 to n+ and poly 1 layer contacts are then etched through the nitride and oxide layers at the selected locations using another patterned PR mask. After a poly 2 layer for device electrodes and interconnections is deposited and patterned by masked etching, a supplemental PR mask can be applied to selectively form poly 2 resistors by covering the resistors during the implant of the poly 2 layer. The first embodiment of the process is concluded with a second isolation oxide growth, a patterned etch for the metallization contacts, a barrier metal deposition, and a deposition and patterned etch of the interconnect metal.

In another manifestation of the fundamental process, the formation of the gate oxide over the active regions is not followed by a poly 1 layer, but rather, by a PR-patterned etch of the oxide to make contact openings between the poly 1 layer and n+ diffusions in the substrate. The poly 1 layer deposited in the immediately succeeding step is first implant doped and then patterned by PR masking and etching to form poly 1 gate electrodes, interconnects and substrate contacts. Thereafter, the n-channel devices are subjected to an S/D implant while the p-channel devices, the SNOS type memory devices, and the poly 1 resistors are masked with PR. The S/D implant for the p-channel devices, defined by a PR mask, and blanket depletion implant for the poly 2 devices follow in order. After the growth of an isolation oxide, patterned PR is used to designate the memory device implant. An oxide etch at the memory device follows.

The formation of the memory device according to the second embodiment, begins with the growth of a thin oxide over the substrate exposed by the oxide etch, and is followed immediately thereafter with the formation of a nitride-based memory dielectric. The nitride layer of the memory dielectric is covered with a poly 2 layer which extends over the complete wafer. Thereafter, the poly 2 layer is etched, using a PR mask, to retain poly 2 at the memory devices and over regions of poly 1 intended to serve as poly 1 resistors. Without altering the PR mask, the poly etch is followed with a nitride etch, and then concluded with an oxide etch to the level of poly 1 layer. Exposed poly 1 and poly 2 is then doped. Note that the substrate remains masked from the diffusion doping by a differentially grown oxide layer formed during the first isolation oxidation. The process is completed with a second isolation oxidation, PR masked contact cuts, a barrier metal deposition, and a deposition and patterning of the interconnect metal layer.

These and other beneficial features characterizing the presently disclosed process will be more clearly understood and appreciated upon considering the detailed description which follows.

BRIEF DESCRIPTION OF THE DRAWINGS

FIGS. 1-9 depict schematic cross-sections of the wafer during the process steps which form the isolated wells, establish gate thresholds, and create the gate dielectric layer.

FIG. 10 depicts an optional implant for the formation of depletion mode FETs.

FIGS. 11A-24A depict the wafer cross-section at various stages of fabrication in accordance with the "A" sequence of steps.

FIGS. 11B-24B depict the wafer cross-section at various stages of fabrication in accordance with the "B" sequence of steps.

DETAILED DESCRIPTION

Figure 5:
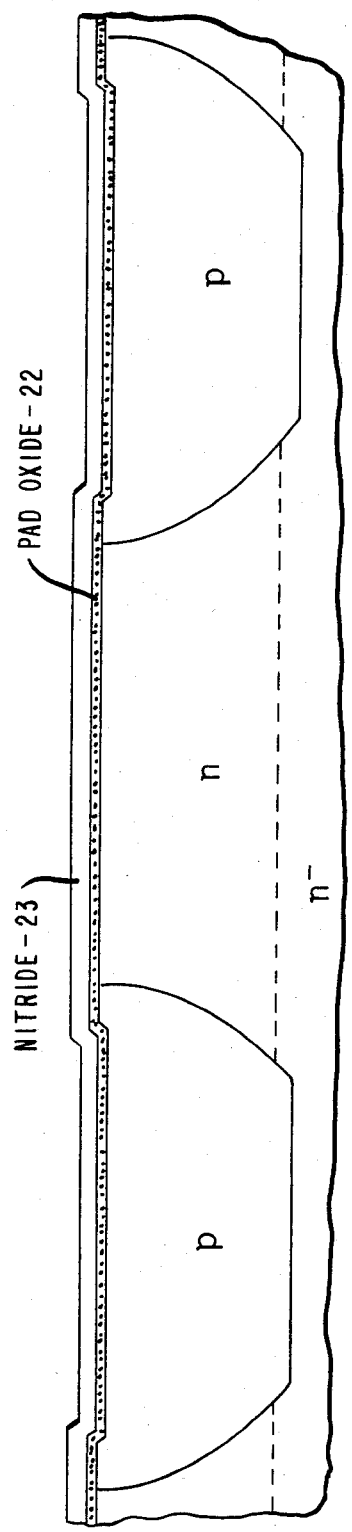

The development of a unified process for the fabrication of electrically isolated SNOS type memory cells and CMOS FET devices on a common substrate or wafer would be relatively mundane were it not for the pervasive demand for minimum masking operations, and the innate sensitivity of the nonvolatile device data retention characteristics to process temperatures encountered after the formation of the memory dielectric. To satisfy these objectives, the present process, illustrated by way of two differing embodiments, minimizes the number of masking operations and limits the temperatures employed during fabricating operations following the formation of the memory dielectric. Furthermore, the present process ensures that nitride layers are selectively eliminated from volatile FETs, provides numerous methods of interconnecting poly layers and doped regions in the substrate, and provides for the formation of poly resistors at selected locations. Though various aspects of the present process appear in the prior art, the unified process selectively and uniquely combines diverse facets at appropriate stages of fabrication to reduce the number of masking operations and to limit fabrication temperatures following the formation of the memory dielectrics.

The process of the present invention will be described by way of two embodiments, correspondingly designated the "A" and "B" sequences of fabrication steps. The initial stages of fabrication for both sequences, generally illustrated in FIGS. 1-10, are substantially identical. However, beginning with FIG. 11, the process steps and their effects on the structure of the wafer differ. The preferred "A" sequence of steps is illustrated in FIGS. 11A-24A, whereas the alternate embodiment in the "B" sequence of steps is depicted in FIGS. 11B-24B.

It should also be understood that the structures shown in the various figures are intended to convey the conceptual effect of the fabrication process, rather than provide a scale representation of the actual structure. In like manner, the fabrication parameters and dimensions ascribed to the operations and structure are nominal approximations. The high degree of variability between processing equipment inherently imposes compensating refinements for each distinct application. Where appropriate, consistency of the reference numerals is maintained throughout the figures. Since the photolithographic processes by which photoresist is patterned and stripped are commonly known or readily perceived from the operations described, reference to photoresist will be limited to relatively unique situations of retention or removal.

Referring to FIG. 1, the "A" embodiment of the process begins with a <100> monocrystalline silicon substrate or wafer, 1, doped n$^-$ to have 5-30 ohm cms resistivity. Substrate 1 is first oxidized, to grow a layer of 400 Angstroms of oxide 2, and then subjected to a phosphorus implant 3 with a dose of $2 \times 10^{12}$ ions per cm$^2$ and an energy of 125 KeV to form a doped region 4 in substrate 1. Oxide 2 is then removed by common etching. FIG. 2 shows substrate 1 after another oxidation, to form a new oxide layer 6 of 6500 Angstroms. The thermal environment of the oxidation step drives the phosphorus implant into substrate 1 to form n-well region 7.

The wafer structure in FIG. 2 is then subjected to photolithographic processing with mask #1 to define the etch pattern in oxide 6. As shown in FIG. 3, oxide 6 has undergone an etch to the surface of substrate 1, employing any one of many commonly known oxide etching procedures, and is thereafter regrown from substrate 1 at locations 8 and 9, as layer 11, to a thickness of 400 Angstroms. Implant oxide 11 is sufficiently thin to permit boron implant 12 to penetrate, whereas thicker oxide 6 serves as an implant barrier. The boron implant, 12, provides a dose of $5 \times 10^{12}$ ions per cm$^2$ at an energy of 60 KeV to form regions 13 in n-well region 7.

To reach the level of fabrication depicted in FIG. 4, the wafer in FIG. 3 is subjected to an oxidation and p-well drive step, preferably involving an environment of N$_2$ and O$_2$ at 1100°-1200° C. for 10-15 hours. The n-well region, 14, now extends significantly deeper into n$^-$substrate 1, as do diffused p-well regions 16 and 17. In the case of the latter, the p-well/n$^-$junction reaches a depth of 4-8 microns. The ambient during the drive of the n-well and p-well dopants also oxidizes the substrate surface at 8 and 9, to form a composite oxide, 18, of 1000 Angstroms. The steps, 21, formed at the edges of oxide layers 18 over p-wells 16 and 17 are used in succeeding stages of fabrication to align the active area masks. With the conclusion of the well drive, the wafer is subjected to an oxide etch which strips all residual oxide formations.

In deriving the structure depicted in FIG. 5, the wafer previously stripped of oxide is subjected to a brief oxidation to grow 550 Angstroms of PAD oxide 22, which is followed in the manner commonly practiced with an 1100 Angstrom deposition of nitride as layer 23.

Figure 6:
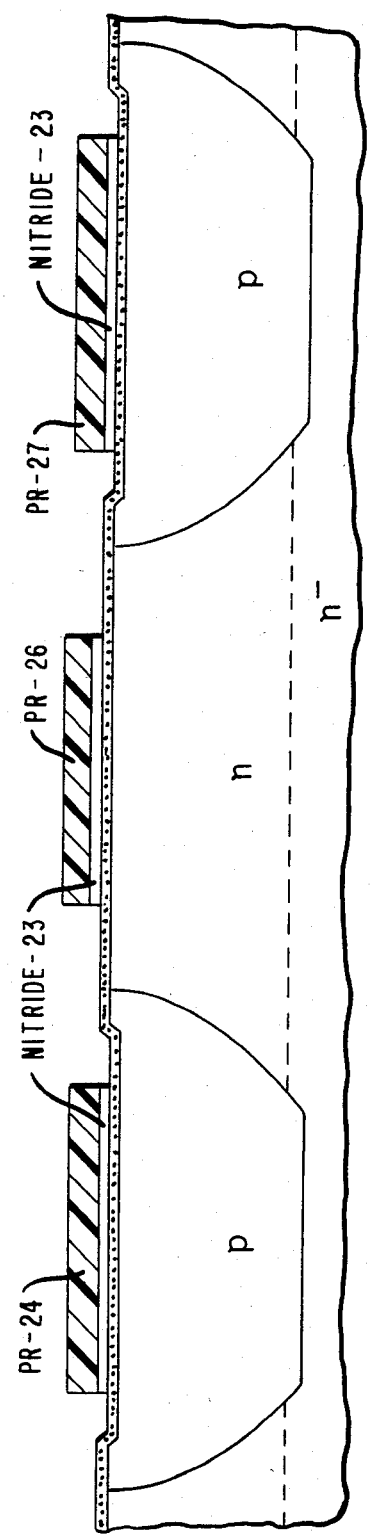

In progressing toward the structure depicted in FIG. 6, a PR layer is deposited and then photolithographically processed to define active areas according to the pattern in fabrication mask #2. Once patterned, PR segments 24, 26 and 27 are subjected to plasma hardening, employing an N$_2$ plasma with 250 watts RF power at 0.6 torr pressure for approximately 20 minutes. These conditions appear suitable for most commercially available positive PR materials, a particular example being type AZ4100 manufactured by Shipley Co., Inc. The hardened PR is then used as a mask for etching nitride layer 23 with a $C_2ClF_5$ or $CF_4+O_2$ plasma.

Without stripping the PR mask segments 24, 26 or 27, another layer of PR is deposited and photolithographically processed to retain segments 28, 29 and 31, in the manner generally illustrated in FIG. 7. Note that the formerly hardened PR segments are unaffected by the processing in the latter PR layer, and therefore retain precise alignment with patterned nitride segments 23. In contrast, the masked area of the n-well under PR segment 26 is shown to be enlarged to the extent of new PR segment 29. With the PR masks in place, the wafer in FIG. 7 is subjected to a boron implant, 32, at a dose of $10^{13}$ ions per cm$^2$ and energy of 70 KeV. The boron doping in regions 33, 34, 36 and 37 prevents inadvertent inversions beneath the field oxides in response to voltage levels on interconnect layers passing over the field oxides.

After boron implant 32, both PR masks are removed in relatively conventional manner with PR solvents and a brief asher operation. To reach the state depicted in FIG. 8, the wafer is then subjected to selective oxidation adequate to create field oxides 38, 39, 41 and 42. The parameters of such operations are well known. For purposes of this embodiment, it is preferred that field oxides 38, 39, 41 and 42 be grown to have a thickness in the range of 6,000–10,000 Angstroms. Nitride 23 prevents the growth of oxide thereunder. Note the presence of the field implant regions 33, 34, 36 and 37.

Upon the completion of the field oxide growth presented in FIG. 8, the substrate is subjected to an oxide strip, to remove oxidized nitride, a nitride strip, to remove residual nitride 23, and another oxide strip, to remove pad oxide 22, all performed in relatively conventional manner. Thereafter, the substrate undergoes another oxidation, in an $O_2+HCl$ or $O_2+$ trichloroethane (TCE) ambient, adequate to form 550 Angstroms thick layers of gate oxide at 43, 44 and 46, as depicted in FIG. 9. The substrate is subjected to a blanket boron implant, 45, with a dose of $3 \times 10^{11}$ ions per cm$^2$ and energy of 40 KeV follows, to establish a nominal gate threshold level for the FETs peripheral to the SNOS type memory devices. The implanted regions are shown at 47, 48 and 49.

The masking and implant operations depicted in FIG. 10 are optional, incorporated in the present embodiment to illustrate steps suitable to fabricate a depletion type n-channel FET on the common wafer. Namely, a PR layer, 51, is deposited and photolithographically processed with mask #4 to expose the p-well at FET location 52. Ion implantation 53 follows. Preferably, the implant utilizes phosphorus or arsenic ions with a dose of approximately $0.7-2 \times 10^{12}$ ions per cm$^2$ and an energy of 100 KeV. The implanted region is shown in 54.

To this point in the process, both embodiments follow the same sequence of operations. With the succeeding step, the embodiments diverge as to operations and their structural effects. To aid in the understanding of the processes, the figure numbers beginning with 11 will include the letter "A" or "B" to differentiate the two embodiments. In view of the general preference for the "A" sequence, that embodiment will be considered first.

The embodiment illustrated by following the "A" sequence of fabrication begins with the schematic cross-section in FIG. 11A. Individual depictions of the regions created by blanket boron implant 45 (FIG. 9) and phosphorus/arsenic implant 53 (FIG. 10) have been deleted hereinafter to maintain the focus of attention on the new process steps. The effects of both implants are reflected in the device characteristics and in the levels of subsequent implant operations.

In the course of progressing from FIG. 10 to FIG. 11A, the substrate is stripped of PR layer 51, subjected to a brief oxide etch, and covered with 3000–5000 Angstroms of deposited poly 56, hereafter routinely referred to as the poly 1 layer. Preferably, the brief oxide etch is monitored by test wafers to ensure that gate oxide layers 43, 44 and 46 are reduced to a thickness of 500 Angstroms with relative precision. As depicted in FIG. 11A, poly 1 layer 56 is then subjected to a doping operation, 57, with POCl$_3$ so as to reduce the poly 1 resistivity to approximately 20 ohms per cm$^2$.

According to the next arrangement of the wafer structure, depicted in FIG. 12A, conductively doped poly 1 layer 56 is selectively masked by PR segments 58, upon photolithographic processing of the PR with mask #5A. To derive the further structure shown in FIG. 13A, the substrate is subjected to plasma etches first with $SF_6$ and then with $CCl_2F_2$ to pattern poly 1 layer 56, and is followed by an oxide etch with 7:1 buffered HF until the thickness of gate oxide layers 43, 44, and 46 (FIG. 11A) approach 400 Angstroms at locations 59, 61, 62, 63, 64, 66, 67 and 68.

The segments of conductively doped poly 1 shown in FIG. 13A can now be directly related to active devices and interconnects. For instance, poly segment 69 at location 75 and poly segment 71 at location 52 will be the gate electrodes of individual n-channel FETs operating in enhancement and depletion modes, respectively. Poly 1 segments 77 and 78 will be electrical interconnects. Poly 1 segment 72 at location 79 will be the gate electrode of a p-channel, enhancement mode FET. Poly 1 segments 73 and 74 at locations 81 and 82 will be the gate electrodes of the n-channel enhancement mode FETs for accessing the SNOS type memory device at location 83. In the context of the structure in FIG. 13A, reference to an SNOS type memory cell includes not only the SNOS type memory device at location 83 but also covers the access FETs at immediately adjacent locations 81 and 82. Note that all the poly 1 segments are conductively doped with n-type impurity.

In progressing to the arrangement depicted in FIG. 14A, the wafer is subjected to a PR masking process using fabrication mask #6A to retain PR segments 84. Though PR 84 is shown to be retained over poly 1 layer interconnects such as 77, its central function is to mask the substrate at n-well 14 and memory device location 83 in p-well 17. With mask 84 in place, the wafer is subjected to arsenic implant 86 having a dose of $1-10 \times 10^{15}$ ions per cm$^2$ and an energy of 80 KeV. Note that this implant establishes not only the n-channel device S/D regions, but any diffusion type interconnects intended to lie within the p-wells. However, such diffusions cannot pass beneath retained segments of poly 1, in that the poly 1 layer will mask the underlying substrate region from arsenic implant 86. The presence of implanted arsenic is shown in regions 87, 88, 89, 91 and 92.

The wafer from FIG. 14A is then stripped of residual PR and subjected to an arsenic drive-in anneal operation, generally entailing one hour at 1000° C. in an N$_2$ ambient. To cap exposed poly 1 segments, and thereby avoid out-diffusion of dopant, the anneal is initiated with a brief N$_2$+O$_2$ environment, growing 100–500 Angstroms of oxide on the poly 1 surface. Note the presence of oxide layer 93 covering the poly 1 segments in FIG. 15A. As shown in FIG. 15A, the anneal creates n+ S/D regions 94, 96, 97, 98 and 99.

Boron implant 101 which follows is directed to n-well 14 by patterned PR layer 102. The PR pattern is defined by fabrication mask #7A. The conditions for boron implant 101 are preferably a dose of $1-10 \times 10^{15}$ ions per $cm^2$ at 30 KeV. The boron implanted regions are shown at 103 and 104. Note that poly 1 segment 72 is also subjected to the dose of boron ions by virtue of the limited masking provided by the thin oxide cap. However, segment 72 remains n-type because the POCl$_3$ doping is significantly greater in magnitude than the doping contributed by boron implant 101.

The wafer from FIG. 15A is then subjected to a depletion implant, 106, using phosphorus or arsenic with a dose of $1-2 \times 10^{12}$ ions per $cm^2$ and an energy of 110 KeV, as depicted in FIG. 16A. Again, the relatively light dosage does not alter the impurity type of formerly doped regions, namely p+ implanted regions 103 and 104, but does adjust the channel region impurity level at location 83 to ensure depletion mode operation of the series, nonmemory active devices created during the formation of the SNOS type memory device. The implanted region is shown at 107.

Following the implant performed according to FIG. 16A, the wafer is subjected to a first isolation oxidation step. The oxidation is conducted at 900° C. and continued until 1000 Angstroms of oxide 105 is grown from the poly 1 segments and the silicon substrate. This oxidation procedure also drives and activates the boron implanted into regions 103 and 104, to form p+ S/D regions 108 and 109 as shown in FIG. 17A.

With the p-channel S/D regions in place, the process steps now focus on the operations necessary to fabricate the nonvolatile SNOS type memory cells, typified by the cell at 83. First, PR layer 111 is photolithographically patterned using fabrication mask #8A to open the memory region of the nonvolatile memory device. Using PR layer 111 as a mask, the wafer is subjected to a boron implant, 112, having a dose of $10^{12}$ ions per $cm^2$ and an energy of 100 KeV. This implant centers the memory window in the manner described in the aforementioned U.S. patent application having Ser. No. 352,734. The implanted region is shown at 113 in FIG. 17A.

Without removing masking PR layer 111, the wafer of FIG. 17A is subjected to an oxide etch until the surface of region 113 is exposed. After PR stripping the structure appears as depicted in FIG. 18A.

In progressing toward the arrangement depicted in FIG. 19A, the wafer undergoes the formation of a nitride-based memory dielectric. The memory dielectric has an initial 20-30 Angstrom thick layer of memory oxide 114 and a final 200-400 Angstrom thick composite layer of oxynitride-nitride 116. The formation is preferably initiated with a conventional oxidation ambient, which is thereafter converted to a low pressure chemical vapor deposition (LPCVD) ambient employing SiCl$_2$H$_2$+NH$_3$+N$_2$O at 750° C. for a period of 50 minutes.

To reach the level of fabrication represented in FIG. 19A, nitride layer 116 is covered with PR layer 117, which layer is shown as having been photolithographically patterned using mask #9A. Thereafter, the regions not masked with PR layer 117 are initially etched with a C$_2$ClF$_5$ or CF$_4$+O$_2$ plasma to remove exposed areas of nitride 116, and then etched with 7:1 buffered HF to remove exposed isolation oxide 105.

The contact cut depicted in FIG. 19A at location 119 provides for interconnecting a subsequently deposited poly 2 layer with S/D region 97 and poly 1 segment 77. This feature will be developed in the ensuing discussion.

Referring now to FIG. 20A, the wafer is shown after the deposition of poly 2 layer 121, and photolithographic processing of PR using mask #10A to retain PR layer segments 122. The pattern of PR segments 122 masking poly 2 layer 121 not only defines the connection at 119, but also establishes the location of poly 2 resistor regions such as will be formed at location 123. In addition, PR mask 122 patterns the poly 2 electrode of the SNOS type memory device at location 83. With PR 122 in place, the wafer is subjected to an etch of poly 2 layer 121 and nitride layer 116, preferably using a SF$_6$ and C$_2$ClF$_5$ plasma etchants, respectively.

The poly resistor to be formed at location 123 can be adjusted as to impedance by utilizing an optional blanket implant of phosphorus or arsenic ions, immediately preceding the interconnect doping implant, 124, depicted in FIG. 21A. For example, if the poly resistor is to be formed from polycrystalline silicon having gigaohm per square resistivity, no blanket implant of patterned poly 2 would be undertaken. Whereas, if the poly 1 resistors is to be formed from poly 2 having megaohm per square resistivity, a blanket implant of $10^{14}$ ions per $cm^2$ at 100 KeV would be suitable.

Following the optional poly 2 resistor implant, a PR layer is deposited and photolithographically processed to retain masking PR segments 131 and 132 as shown in FIG. 21A. An interconnect doping implant employing phosphorus or arsenic with a dose of $10^{16}$ and an energy of 100 KeV follows. At the conclusion of implant 124, any poly 2 exposed to the implant is conductively doped, whereas masked poly 2 such as at location 123, under masking PR 131, remains highly resistive. Thereby, poly resistor 133 is formed. Note that the conductively doped poly 2 also forms interconnects, such as between S/D region 97 and poly 1 layer interconnect 77, and further provides for the conductive doping of poly 2 electrodes such as 128 for the SNOS type memory device at location 83.

A beneficial, but optional, implant anneal at 750°–900° C. in an N$_2$+O$_2$ ambient can be performed at this stage.

In progressing to the configuration shown in FIG. 22A, the wafer is first subjected to a second isolation oxide growth, forming 300-1000 Angstroms of additional oxide from exposed poly 2. Thereafter, the wafer is coated with a 5000 Angstrom deposition of low temperature oxide (LTO), using conventional LPCVD techniques, for passivation. A densification of the LTO follows, using an O$_2$ environment at 750°–800° C. for 15-30 minutes.

Figure 23A:
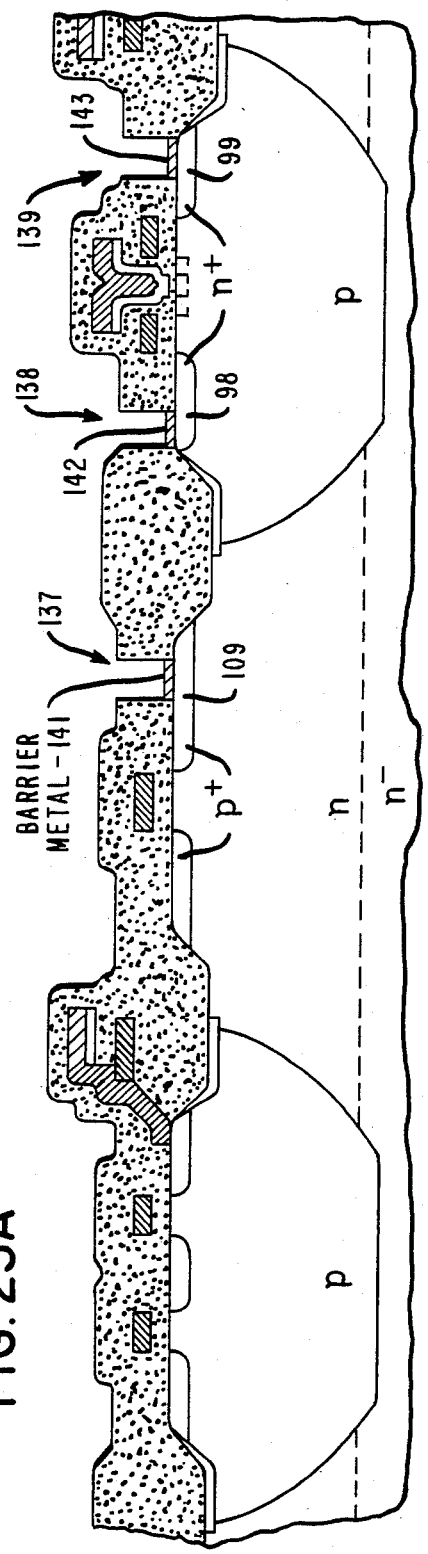

As shown in FIG. 22A, the oxide-covered wafer is coated with a PR material, which material has been photolithographically patterned using fabrication mask #12A to retain PR segments 134 and expose interlayer oxide 136 at contact cut locations 137, 138 and 139. A contact etch, preferably employing 7:1 buffered HF, exposes the substrate surface at S/D regions 98, 99 and 109 as shown in FIG. 23A. The optional implant anneal operation described in the immediately preceding paragraph can be applied now if preferred. At this stage of fabrication, an H$_2$ ambient memory anneal at 750°–900° C. for 30 minutes is utilized to obtain the full capability of the nonvolatile SNOS type memory device. As shown in FIG. 23A, the contact openings at 137, 138 and 139 are thereafter covered with tungsten barrier metal 141, 142 and 143 using tungsten hexafluoride in a low pressure $H_2$ ambient. The tungsten barrier metal deposition is highly selective because the silicon is the catalyst for the deposition.

The presently embodied process is concluded in relatively conventional manner, beginning with a deposition of a metal interconnect layer composed of aluminum/silicon or aluminum/silicon/copper to a thickness of 10,000 Angstroms. Following the deposition, PR is photolithographically processed using mask #13A to form the pattern for selective etching which follows. Patterned interconnect metal is shown at 144 and 146 in FIG. 24A. Thereafter, the wafer is subjected to an alloying operation, at a temperature of 425°–450° C., and is covered with passivation layer 147. Passivation layer 147 is composed of silox or plasma nitride and formed to a thickness of 10,000 Angstroms. Fabrication according to this embodiment is concluded with a passivation definition mask, using PR using mask #14A, and a plasma or wet etch to open the bonding pads for each chip on the wafer.

It should be appreciated that the steps characterizing the "A" sequence of the process provide a full complement of CMOS FETs, in combination with SNOS type memory cells in isolated wells, employs multiple poly layers with diverse interlayer connections, and provides for the formation of poly resistors of prescribed impedance at individually selectable locations. Foremost, these diverse and often inconsistent objectives are obtained in a unified process which requires significantly fewer masks than contemplated for the degree of composite complexity, and which avoids subjecting the wafer to high temperature environments after the formation of the SNOS type memory device dielectric.

Though the process is preferably practiced in the manner of the "A" sequence described above, the fundamental concepts are amenable to other implementations. As a particular example of a variant, consider the "B" sequence as described in the ensuing development. It should be noted that the "B" sequence has the attribute of one less masking operation. However, the "B" sequence includes a critical oxide growth and etch operation, the success of which depends on the differential oxidation rate between polycrystalline and monocrystalline silicon. Other, less pronounced distinctions will also be recognized during the development of the "B" sequence which follows.

The point of departure for the "B" sequence follows the depletion implant depicted in FIG. 10, namely with FIG. 11B. According to the structure depicted in FIG. 11B, the formation of PR layer 148, by photolithographic processing with mask #5B, is followed with an oxide etch to expose the surface of p-well 16 at poly 1-to-n+ contact location 151.

To reach the stage of fabrication shown in FIG. 12B, the wafer is stripped of PR 148 and subjected to a controlled gate oxide etch until 500 Angstroms of gate oxides 152, 153 and 154 remain. Then the wafer is covered with a poly 1 layer deposition, 156, to a nominal thickness of 3000–5000 Angstroms, and subjected to an implant of phosphorus or arsenic 157 at a dose of $1.6 \times 10^{14}$ ions per cm$^2$ and an energy of 110 KeV. Implant 157 defines the poly 1 layer resistivity for the poly 1 layer resistors to be patterned at a later stage of fabrication. After doping and annealing, poly 1 exhibits a resistivity of 1–10 megaohms per square.

FIG. 13B shows the pattern of PR layer 158, used to define the poly 1 interconnects, resistors and gate electrodes. PR layer 158 is patterned by photolithographic processing with fabrication mask #6B.

FIG. 14B represents the wafer structure following an etch of poly 1 layer 156, a strip of PR 158, and an etch of gate oxides 152, 153 and 154 back to a thickness of 400 Angstroms in regions not masked by retained poly 1 layer 156. The poly etch is performed with plasmas of $SF_6$ and then $CCl_2F_2$. The oxide etch employs 7:1 buffered HF.

Thereafter, according to the "B" sequence of fabrication in FIG. 15B the wafer is masked with PR 159, which PR has been photolithographically patterned using fabrication mask #7B. Arsenic S/D implant 161 follows, using a dose of $1–10 \times 10^{15}$ and an energy of 80 KeV. Though masked at PR 159 formations, the arsenic implant readily penetrates any of the 400 Angstrom layers of oxide, to provide n-type dopant to regions 162, 163, 164, 166 and 167 in p-wells 16 and 17. Note that resistively doped poly 1 segment 168, the p-channel FET at location 169, and the SNOS type memory device at location 171 are masked from the implant.

In progressing from the structure in FIG. 15B to that in FIG. 16B, the wafer is first subjected to an arsenic drive operation, preferably involving approximately one hour at 1000° C. in an $N_2$ ambient. To minimize the loss of arsenic dopant implanted during operation 161 into exposed poly segments 174, 176, 177, 178, 179, 181 and 182, the arsenic drive step is initiated with an $O_2$ environment to form a cap of oxide 172 on the top and sides of the poly segments. The photolithographic processing of PR with fabrication mask #8B follows, forming patterned PR 183. PR 183 exposes the p-channel FET regions of the wafer to boron implant 184, which implant preferably provides a dose of $1–10 \times 10^{15}$ ions per cm$^2$ at an energy of 30 KeV. Though poly 1 gate electrode 178 is also subject to doping from boron S/D implant 184, the application of $POCl_3$ counterdoping at a concluding stage in the "B" sequence of fabrication will ensure the n-type impurity of the gate electrode. Regions 186 and 187 in FIG. 16B are the boron implanted regions of n-well 14.

Following the boron implant in FIG. 16B, the wafer is given a blanket implant, 188, with phosphorus or arsenic in the manner depicted in FIG. 17B. A preferable dose is $1–2 \times 10^{12}$ ions per cm$^2$ at an energy of 110 KeV. During this implant, the SNOS type memory device at location 171, between access gating FET electrodes 179 and 181, is depletion doped in region 189. Though poly 1 resistor 168 is also exposed to implant 188, the low dose ensures that the resistivity of the poly 1 resistor is not changed to a significant extent.

To reach the level of fabrication depicted in FIG. 18B, the wafer from FIG. 17B is oxidized to form first isolation oxide layer over all polycrystalline and monocrystalline silicon on the wafer. The character of this oxidation step is important, in that the succeeding fabrication steps depend upon the differential growth rate of the oxide grown from poly 1 segments 174, 176, 177, 178, 179, 181 and 182 as compared to the growth from S/D regions 162, 163, 164, 166, 167, 191 and 192. In particular, the oxidation conditions should maximize the differential growth rate and should be sustained until the thickness of S/D region oxides 193 exceed the thickness of poly 1 layer oxides 194 by 500–1000 Angstroms. Suitable conditions are comprised of a wet $O_2$ oxidation at 750° C. for approximately 20 minutes. It should be understood that this oxidation step also serves to drive-in boron implant 184 (FIG. 16B) and thereby establish p+ type S/D regions 191 and 192.

FIG. 18B also shows the presence of masking PR 196, covering the wafer in all but the memory implant opening centered within the SNOS type memory device at location 171. The pattern of the PR is established with fabrication mask #9B. Boron implant 197 adjusts the center region, 198, of the memory device to have a nominal threshold level of zero volts. A suitable boron implant dose is $10^{12}$ ions per $cm^2$ at an energy of 100 KeV. The implant readily penetrates the first isolation oxide covering region 198.

With masking PR 196 in place, the wafer is subjected to an oxide etch, principally at memory device location 171, until the substrate at region 198 is exposed. Upon concluding the oxide etch and stripping of PR 196, the wafer has the appearance depicted in FIG. 19B. Note that the substrate surface is exposed at region 198, but remains masked by oxide in immediately adjacent regions. The structure in FIG. 19B is preparatory to the formation of the SNOS type memory device.

Figure 19B:
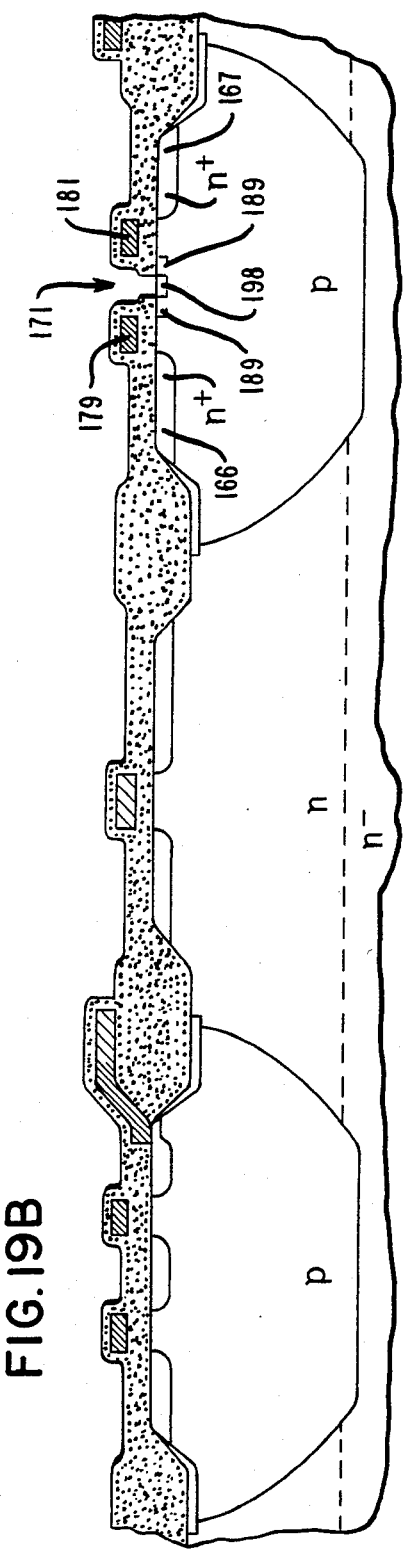
Figure 20B:
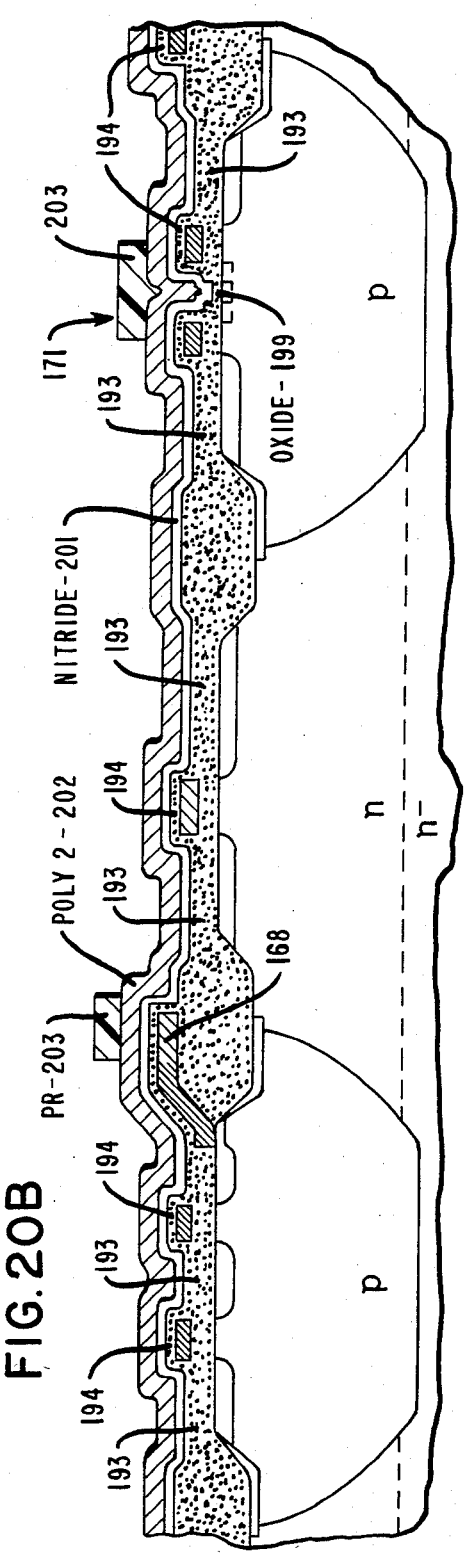

The wafer from FIG. 19B is then processed to form the nitride-based memory dielectric shown in FIG. 20B. The memory dielectric has an initial 20-30 Angstrom thick layer of memory oxide 199 and a final 200-400 Angstrom thick composite layer of oxynitride-nitride 201. The formation is preferably initiated with a conventional oxidation ambient, which is thereafter converted to an LPCVD ambient having a combination of $SiCl_2H_2+NH_3+N_2O$ at a temperature of 750° C. for a period of 50 minutes.

In FIG. 20B, nitride layer 201 is shown covered by poly 2 layer 202 to a thickness of 3000 Angstroms. With the memory dielectric and poly 2 layers in place, the wafer is covered with PR and photolithographically processed using fabrication mask #10B to retain PR segments 203 over poly 1 resistor region 168 and the SNOS type memory device at location 171.

The wafer cross-section illustrated in FIG. 21B represents the structure following, among other steps, an etch of poly 2 layer 202 (FIG. 20B) and nitride layer 201 preferably performed with a $SF_6+C_2ClF_5$ plasma. Following the poly 2/nitride etch, the wafer is subjected to a controlled etch of differentially grown oxides 193 and 194 (FIG. 20B) with 7:1 buffered HF. The oxide etch is performed with sufficient care to ensure that the polycrystalline silicon grown oxides 194 are removed to expose poly 1 layers 174, 176, 177, 178, 179, 181 and 182 while sufficient residuals of monocrystalline silicon grown oxides 193 remain over S/D regions 162, 163, 164, 166, 167, 191 and 192 to mask the immediately succeeding $POCl_3$ doping, 204. As noted earlier, masking oxide 206 should be at least 500 Angstroms thick.

$POCl_3$ doping 204, which follows, further dopes poly 1 layer gate electrodes 174, 176, 179 and 181, counter-dopes to heavy n-type impurity the doping of p-channel FET gate electrode 178, conductively dopes poly 2 layer interconnect 207 and poly 1 layer interconnect 182, conductively dopes poly 2 SNOS type memory device control electrode 208, and further dopes poly 1 layer interconnect segment 177 and its buried contact with n+ type S/D diffusion 164. Note that poly 1 layer resistor 168 remains intact by virtue of the masking provided by poly 2 layer segment 207.

FIG. 22B schematically depicts the wafer following the addition of oxide dielectric. Preferably, the wafer is first subjected to an optional second isolation oxidation, forming approximately 300-1000 Angstroms of poly-grown oxide, and then receives an LTO (LPCVD) deposition of 5000 Angstroms. Thereafter, the oxide, generally at 209, is densified in an $O_2$ ambient at 750°-800° C. for 15-30 minutes. FIG. 22B also shows PR layer 211, photolithographically patterned with fabrication mask #11B to expose oxide 209 at contact cut locations 212, 213 and 214.

At this stage in the wafer fabrication, it may be of value to note the structural similarities between the wafer depicted in FIG. 22B and that depicted in FIG. 22A.

Fabrication according to the "B" sequence reaches the concluding stages with an oxide etch, preferably employing 7:1 buffered HF, a PR strip, and an $H_2$ environment anneal at approximately 750°-900° C. for 30 minutes. The anneal enhances the retention characteristics of the nonvolatile SNOS type memory device located at 171 in FIG. 23B. Selective depositions of tungsten barrier metal, 216, 217 and 218, follow.

The final structure according to the "B" sequence, as depicted in FIG. 24B, is derived by depositing 10,000 Angstroms of aluminum/silicon or aluminum/silicon/copper metal, 219, onto the wafer depicted structurally in FIG. 23B. A metal defining PR pattern, formed with fabrication mask #12B, is followed with a metal etch, a metal alloy at 425°−450° C. and the deposition of passivation layer 221. Passivation layer 221 may be either plasma nitride or silox, preferably to a thickness of 10,000 Angstroms.

As is common, a passivation-defining PR layer, using fabrication mask #13B, is followed by a passivation etch to complete the wafer fabrication process.

Figure 24A:
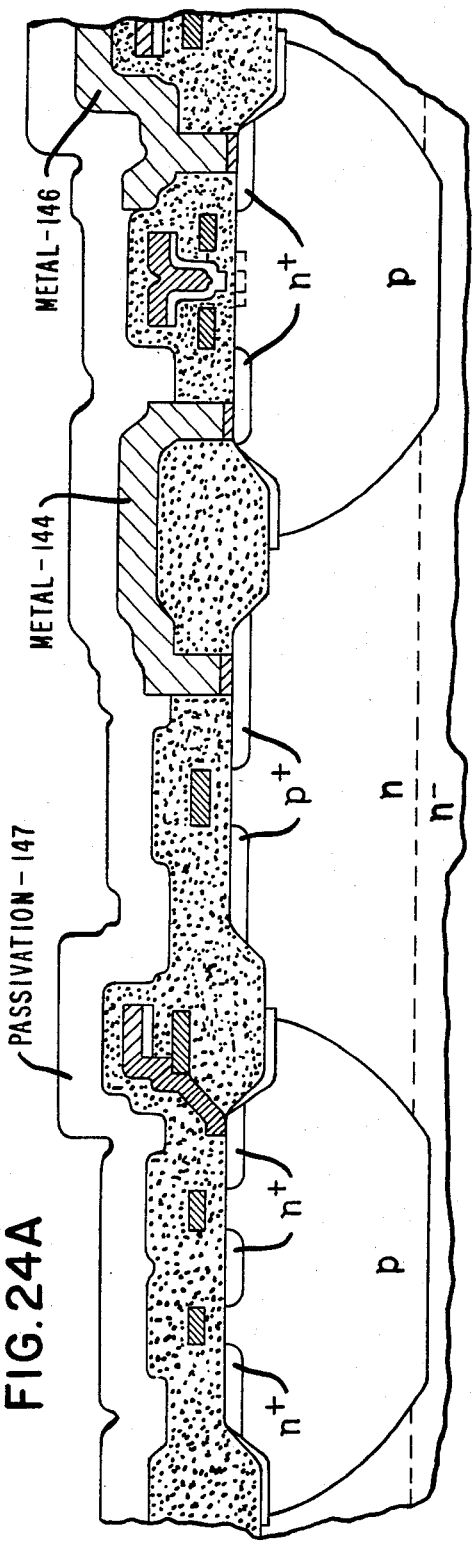

In comparing the wafers fabricated according to the "A" and "B" sequences, appearing respectively in FIGS. 24A to 24B, it is visibly apparent that they form substantially identical structures. The material exception is the level of the poly resistors. However, the "A" sequence does require one more masking operation than prescribed in the "B" sequence. On the other hand, the "B" sequence imposes rigid constraints on the differential oxidation and oxide etching operation spanning FIGS. 17B to 21B.

A particularly beneficial aspect of both embodiments may not be readily apparent without explicit designation. Namely, the sequence of the process steps characterizing both embodiments limits the process temperatures to levels no greater than 900° C. for all operations following the formation of the SNOS type memory device dielectric layers.

Though both embodiments utilize polycrystalline silicon for gate electrodes and interconnects, including the SNOS type memory device gate electrode, the process and memory device structure can be implemented with other conductive materials. In the case of such variants, grown isolation oxide layers would be replaced with otherwise formed dielectric materials. In like manner, it is fully contemplated that those skilled in the art will readily interchange wet and dry etching operations according to their preferences. Therefore, while the invention has been particularly shown and described with reference to preferred embodiments, it should be understood that various changes in form and detail may be made without departing from the scope and spirit of the invention as claimed.

We claim:

1. A unified process for fabricating CMOS and SNOS type devices on a semiconductor substrate, comprising the steps of:
   forming wells of first and second impurity type in a common semiconductor substrate;
   forming field oxides between the wells;
   forming gate oxide layers over the wells;
   forming a first patterned conductive layer over the field oxides and gate oxide layers as gate and interconnect electrodes;
   selectively doping regions in the first and second impurtiy type wells to form interconnect and S/D regions selectively self-aligned with the first patterned conductive layer and of an impurity type opposite that of the respective well;
   lightly doping the substrate at the SNOS device with a impurity type opposite that of the SNOS device well;
   forming a first isolation oxide layer over the first patterned conductive layer and the selectively doped regions;
   selectively removing oxide from over the SNOS device to expose the semiconductor substrate;
   forming a memory dielectric over the exposed semiconductor substrate;
   selectively removing memory dielectric and oxide from the selectively doped regions in the first and second impurity type wells;
   forming a second patterned conductive layer over the semiconductor substrate;
   forming a second isolation dielectric layer over the second patterned conductive layer; and
   forming conductive contacts to selectively interconnect the doped interconnect regions, the S/D regions, the first patterned conductive layer and the second patterned conductive layer.

2. The process recited in claim 1, wherein said step of forming a first patterned conductive layer is comprised of:
   depositing a first poly layer;
   heavily doping the first poly layer with first impurity type dopant; and
   selectively etching the doped first poly layer.

3. The process recited in claim 2, wherein said step of forming a first isolation oxide layer is comprised of growing oxides from the semiconductor substrate and the first poly layer.

4. The process recited in claim 3, wherein said steps of forming a memory dielectric and selectively removing memory dielectric and oxide are comprised of:
   growing a very thin oxide layer;
   forming a nitride-based dielectric layer; and
   selectively etching the nitride-based dielectric layer and any oxide layers to selectively expose interconnect and S/D regions.

5. The process recited in claim 4, wherein said step of forming a second patterned conductive layer is comprised of:
   depositing a second poly layer;
   resistively doping the second poly layer with first impurity type dopant;
   selectively etching the second poly layer; and
   heavily doping selected regions of the second poly layer.

6. The process recited in claim 5, including the step of selectively implanting the SNOS device to center the memory window performed before said step of selectively removing oxide from over the SNOS device.

7. A unified process for fabricating CMOS and SNOS type devices on a common semiconductor substrate, comprising the steps of:
   forming wells of first and second impurity type in a common semiconductor substrate;
   forming field oxides between the wells;
   forming gate oxide layers over the wells;
   selectively removing oxide from over the second impurity type wells;
   forming a first patterned conductive layer over the field oxides and gate oxides layers as gate and interconnect electrodes;
   selectively doping interconnect and S/D regions, to selectively self-align with the first patterned conductive layer, in the second impurity type wells, and selected regions in the first patterned conductive layer, using first impurity type dopant;
   selectively doping interconnect and S/D regions, to selectively self-align with the first pattern conductive layer, in the first impurity type wells using second impurity type dopant;
   lightly doping the substrate at the SNOS device with an impurity type opposite of that of the SNOS device well;
   forming a first isolation oxide layer, so that the thickness of the oxide over the first patterned conductive layer is significantly less than the thickness of the oxide over the remaining semiconductor substrates;
   selectively removing oxide from over the SNOS device to expose the semiconductor substrate;
   forming a memory dielectric over the exposed semiconductor substrate;
   forming a second patterned conductive layer over the semiconductor substrate;
   selectively removing memory dielectric using the second patterned conductive layer as a mask;
   removing the first isolation oxide until the first patterned conductive layer, not masked by the second patterned conductive layer, is exposed;
   doping the exposed regions of the first and second patterned conductive layers with first impurity type dopant;
   forming an isolation dielectric layer over the semiconductor substrate; and
   forming conductive contacts to selectively interconnect the doped interconnect regions, the S/D regions, the first patterned conductive layer, and the second patterned conductive layer.

8. The process recited in claim 7, wherein said steps of forming a first patterned conductive layer and selectively doping interconnect and S/D regions in the second impurity type wells are comprised of:
   depositing a first poly layer;
   resistively doping the first poly layer with first impurity type dopant;
   selectively etching the first poly layer; and
   heavily doping selected interconnect and S/D regions in the second impurity type wells, and selected regions in the first poly layer, with first impurity type dopant.

9. The process recited in claim 8, wherein said step of forming the first isolation oxide layer is comprised of:
   growing oxide from the first poly layer and the semiconductor substrate at an accentuated differential rate until the thickness of the oxide over the substrate is at least 400 Angstroms greater than the thickness of the oxide over the first poly layer.

10. The process recited in claim 9 wherein said step of forming a memory dielectric layer is comprised of:
growing a very thin oxide layer; and
forming a nitride-based dielectric layer.

11. The process recited in claim 5, wherein said steps beginning with forming a second patterned conductive layer and concluding with doping the exposed regions are comprised of:
depositing a second poly layer;
selectively etching the second poly layer to retain regions over the SNOS devices and resistively doped regions of the first poly layer;
selectively etching the nitride-based dielectric layer, the very thin oxide layer, and the oxide grown at a differential rate, to expose the heavily doped regions in the first poly layer; and
heavily doping exposed regions of the first and second poly layers with first impurity type dopant.

12. The process recited in claim 11, including the step of selectively implanting the SNOS devices to center the memory window, performed before said step of selectively removing oxide from over the SNOS devices.

13. The process recited in claim 6, wherein said step of forming conductive contacts is comprised of:
etching contact cuts through the isolation dielectric layer and the oxide layers to selectively expose doped interconnect regions, S/D regions, in poly layers;
forming barrier metal contacts to the exposed poly layers and semiconductor substrate regions; and
forming selectively patterned metallic interconnects.

14. The process recited in claim 12, wherein said step of forming conductive contacts is comprised of:
etching contact cuts through the isolation dielectric layer and the oxide layers to selectively expose doped interconnect regions, S/D regions, in poly layers;
forming barrier metal contacts with the exposed poly layers and semiconductor substrate regions; and
forming selectively patterned metallic interconnects.

* * * * *